United States Patent
Todorokihara

(10) Patent No.: US 12,028,092 B2
(45) Date of Patent: Jul. 2, 2024

(54) FREQUENCY DELTA-SIGMA MODULATION SIGNAL OUTPUT CIRCUIT AND SENSOR MODULE

(71) Applicant: SEIKO EPSON CORPORATION, Tokyo (JP)

(72) Inventor: Masayoshi Todorokihara, Suwa (JP)

(73) Assignee: SEIKO EPSON CORPORATION (JP)

( * ) Notice: Subject to any disclaimer, the term of this patent is extended or adjusted under 35 U.S.C. 154(b) by 21 days.

(21) Appl. No.: 18/079,048

(22) Filed: Dec. 12, 2022

(65) Prior Publication Data
US 2023/0188158 A1    Jun. 15, 2023

(30) Foreign Application Priority Data

Dec. 13, 2021 (JP) .................. 2021-201472

(51) Int. Cl.
*H03M 3/00* (2006.01)
*G01C 9/06* (2006.01)
*H03C 3/00* (2006.01)
*H03L 7/085* (2006.01)

(52) U.S. Cl.
CPC ............. *H03M 3/30* (2013.01); *G01C 9/06* (2013.01); *H03C 3/00* (2013.01); *H03L 7/085* (2013.01); *H03M 3/00* (2013.01); *H03M 3/38* (2013.01)

(58) Field of Classification Search
CPC . H03M 3/30; H03M 3/00; H03M 3/38; H03C 3/00; G01C 9/06; H03L 7/085
See application file for complete search history.

(56) References Cited

U.S. PATENT DOCUMENTS 7,276,985 B2 * 10/2007 Hirano .................. H03C 3/095
                                                                332/151
2019/0334544 A1    10/2019 Todorokihara

FOREIGN PATENT DOCUMENTS

JP          2019-191066 A    10/2019

* cited by examiner

*Primary Examiner* — Joseph J Lauture
(74) *Attorney, Agent, or Firm* — Harness, Dickey & Pierce, P.L.C.

(57) ABSTRACT

A frequency delta-sigma modulation signal output circuit includes: a phase modulation circuit configured to generate n delay signals obtained by delaying a measurement target signal, n being an integer of 2 or more, and generate a phase modulation signal by randomly selecting one of the n delay signals in synchronization with the measurement target signal; and a frequency ratio digital conversion circuit configured to generate a frequency delta-sigma modulation signal using a reference signal and the phase modulation signal.

7 Claims, 20 Drawing Sheets

FREQUENCY DELTA-SIGMA MODULATION SIGNAL OUTPUT CIRCUIT AND SENSOR MODULE

The present application is based on, and claims priority from JP Application Serial Number 2021-201472, filed Dec. 13, 2021, the disclosure of which is hereby incorporated by reference herein in its entirety.

BACKGROUND

1. Technical Field

The present disclosure relates to a frequency delta-sigma modulation signal output circuit and a sensor module.

2. Related Art

A frequency delta-sigma modulation signal output circuit that generates a frequency delta-sigma modulation signal corresponding to a ratio between a frequency of a reference signal and a frequency of a measurement target signal is known. The frequency delta-sigma modulation signal output circuit includes a frequency delta-sigma modulator, and performs, by the frequency delta-sigma modulator, frequency delta-sigma modulation on the measurement target signal using the reference signal, and generates a frequency delta-sigma modulation signal. In general, it is known that when the measurement target signal is sampled with the reference signal, periodic quantization noise called an idle tone is generated. When a large idle tone is generated, accuracy of the frequency delta-sigma modulation signal is significantly degraded.

In order to solve this problem, JP-A-2019-191066 discloses a frequency delta-sigma modulation signal output circuit including a phase modulation circuit that generates a plurality of delay signals obtained by delaying a measurement target signal and outputs a phase modulation signal by periodically selecting any one of the plurality of delay signals, and a frequency ratio digital conversion circuit that generates a frequency delta-sigma modulation signal using a reference signal and the phase modulation signal.

According to the frequency delta-sigma modulation signal output circuit described in JP-A-2019-191066, an idle tone is reduced by using the phase modulation signal in which the phase of the measurement target signal is modulated, and therefore, a noise component included in the frequency delta-sigma modulation signal is reduced, but further reduction of the noise component is required.

SUMMARY

An aspect of a frequency delta-sigma modulation signal output circuit according to the present disclosure includes: a phase modulation circuit configured to generate n delay signals obtained by delaying a measurement target signal, n being an integer of 2 or more, and generate a phase modulation signal by randomly selecting one of the n delay signals in synchronization with the measurement target signal; and a frequency ratio digital conversion circuit configured to generate a frequency delta-sigma modulation signal using a reference signal and the phase modulation signal.

Another aspect of the frequency delta-sigma modulation signal output circuit according to the present disclosure includes: a phase modulation circuit configured to generate n delay signals obtained by delaying a measurement target signal, n being an integer of 1 or more, and generate a phase modulation signal by randomly selecting one of the measurement target signal and the n delay signals in synchronization with the measurement target signal; and a frequency ratio digital conversion circuit configured to generate a frequency delta-sigma modulation signal using a reference signal and the phase modulation signal.

An aspect of a sensor module according to the present disclosure includes: the aspect of the frequency delta-sigma modulation signal output circuit; a physical quantity sensor, in which the measurement target signal is a signal based on an output signal of the physical quantity sensor.

DESCRIPTION OF EXEMPLARY EMBODIMENTS

Hereinafter, preferred embodiments of the present disclosure will be described in detail with reference to the drawings. The embodiments to be described below do not unduly limit contents of the present disclosure described in the claims. Not all configurations to be described below are necessarily essential components of the present disclosure.

1. Frequency Delta-Sigma Modulation Signal Output Circuit 1-1. First Embodiment

Figure 1:
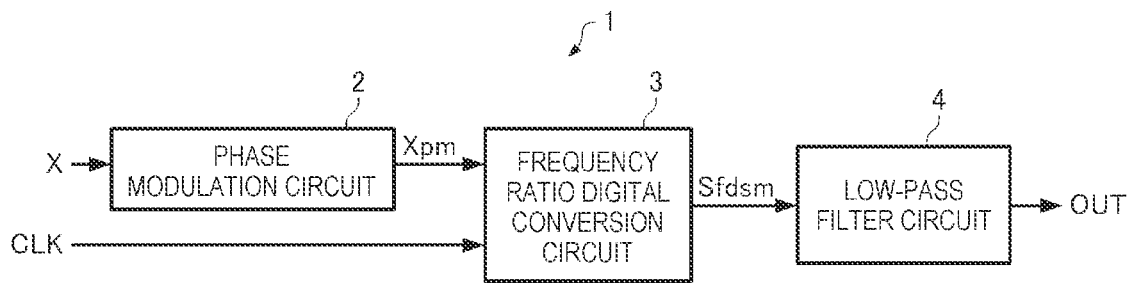
FIG. 1 is a block diagram showing a configuration of a frequency delta-sigma modulation signal output circuit according to a first embodiment.

FIG. 1 is a block diagram showing a configuration of a frequency delta-sigma modulation signal output circuit according to a first embodiment. As shown in FIG. 1, a frequency delta-sigma modulation signal output circuit 1 of the first embodiment includes a phase modulation circuit 2, a frequency ratio digital conversion circuit 3, and a low-pass filter circuit 4.

A reference signal CLK and a measurement target signal X including a frequency signal to be measured is input to the frequency delta-sigma modulation signal output circuit 1. Then, the frequency delta-sigma modulation signal output circuit 1 generates and outputs an output signal OUT indicating a frequency ratio between the measurement target signal X and the reference signal CLK. Since a reciprocal of a frequency is a period, the output signal OUT can also be said to be a signal indicating a period ratio between the measurement target signal X and the reference signal CLK.

The measurement target signal X is input to the phase modulation circuit 2. The phase modulation circuit 2 generates n delay signals obtained by delaying the measurement target signal X, and generates a phase modulation signal Xpm by randomly selecting any one of the n delay signals in synchronization with the measurement target signal X. n is an integer of 2 or more, and delay times of the n delay signals with respect to the measurement target signal X are different from each other.

The frequency ratio digital conversion circuit 3 generates a frequency delta-sigma modulation signal Sfdsm using the reference signal CLK and the phase modulation signal Xpm. The frequency delta-sigma modulation signal Sfdsm is a signal indicating the frequency ratio between the measurement target signal X and the reference signal CLK. Since the reciprocal of the frequency is the period, the frequency delta-sigma modulation signal Sfdsm can be said to be a signal indicating the period ratio between the measurement target signal X and the reference signal CLK.

A filter circuit is provided at a subsequent stage of the frequency ratio digital conversion circuit 3. As shown in FIG. 1, in the present embodiment, the low-pass filter circuit 4 is provided as the filter circuit at the subsequent stage of the frequency ratio digital conversion circuit 3. The low-pass filter circuit 4 extracts a low-frequency component included in the frequency delta-sigma modulation signal Sfdsm, and outputs the extracted low-frequency component as the output signal OUT. As the low-pass filter circuit 4, a general low-pass filter, a lag-lead filter, a lag filter, and the like can be used.

The frequency ratio digital conversion circuit 3 and the phase modulation circuit 2 will be described in detail with reference to FIGS. 2 and 3.

Figure 2:
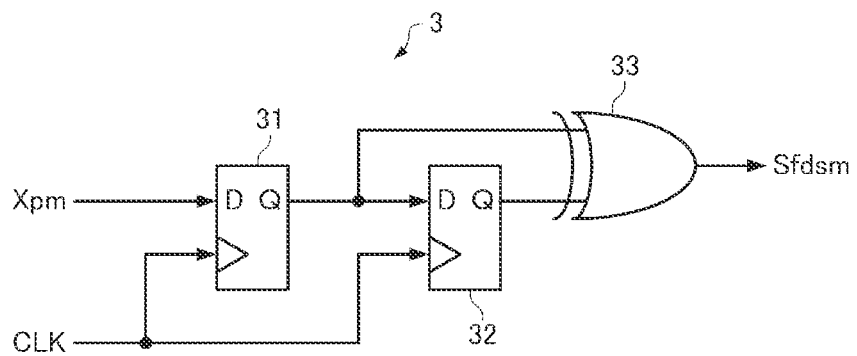
FIG. 2 is a diagram showing a configuration example of a frequency ratio digital conversion circuit according to the first embodiment.

FIG. 2 is a diagram showing a configuration example of the frequency ratio digital conversion circuit 3. As shown in FIG. 2, the frequency ratio digital conversion circuit 3 includes a D flip-flop circuit 31, a D flip-flop circuit 32, and an exclusive OR circuit 33.

The D flip-flop circuit 31 holds the phase modulation signal Xpm in synchronization with a rising edge of the reference signal CLK. The D flip-flop circuit 32 holds the phase modulation signal Xpm held in the D flip-flop circuit 31 in synchronization with the rising edge of the reference signal CLK. The exclusive OR circuit 33 calculates an exclusive OR of a signal held in the D flip-flop circuit 31 and a signal held in the D flip-flop circuit 32, and outputs the exclusive OR as the frequency delta-sigma modulation signal Sfdsm.

In the frequency ratio digital conversion circuit 3 configured as described above, a signal indicating a rising or falling timing of the phase modulation signal Xpm is output as the frequency delta-sigma modulation signal Sfdsm. The frequency ratio digital conversion circuit 3 configured as described above can count both a rising edge and a falling edge of the phase modulation signal Xpm. In other words, in the frequency ratio digital conversion circuit 3 shown in FIG. 2, it is possible to perform counting corresponding to twice the frequency, and it is possible to increase an SNR. The SNR is an abbreviation of a signal-noise ratio.

Figure 3:
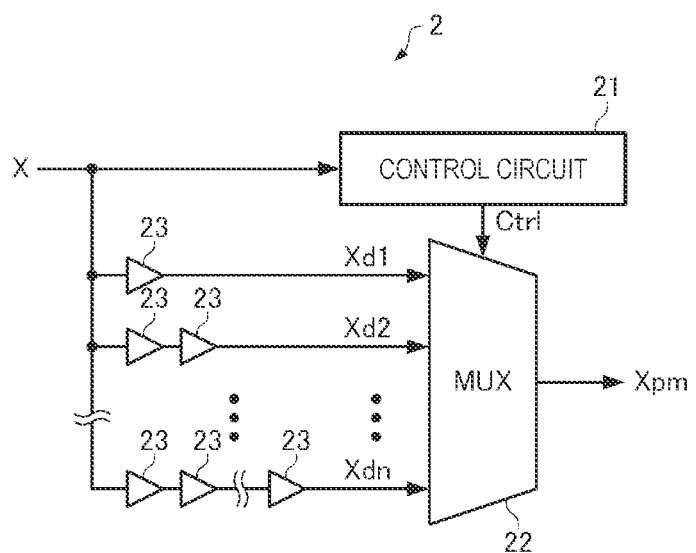
FIG. 3 is a diagram showing a configuration example of a phase modulation circuit according to the first embodiment.

FIG. 3 is a diagram showing a configuration example of the phase modulation circuit 2. As shown in FIG. 3, the phase modulation circuit 2 includes a control circuit 21, a multiplexer 22, and a plurality of delay circuits 23.

The measurement target signal X is input to the control circuit 21. The control circuit 21 generates a control signal Ctrl synchronized with the rise and fall of the measurement target signal X.

n delay signals Xd1 to Xdn and the control signal Ctrl are input to the multiplexer 22. In the example of FIG. 3, the delay signal Xd1 is a signal obtained by passing the measurement target signal X through one delay circuit 23, and the delay signal Xd2 is a signal obtained by passing the measurement target signal X through two delay circuits 23. The delay signal Xdn is a signal obtained by passing the measurement target signal X through n delay circuits 23. That is, for each integer i of 1 or more and n or less, the delay signal Xdi is a signal obtained by passing the measurement target signal X through i delay circuits 23. For example, assuming that the delay times of the n delay circuits 23 are substantially equal to each other, the delay times of the n delay signals Xd1 to Xdn with respect to the measurement target signal X are different from each other.

The multiplexer 22 generates the phase modulation signal Xpm by randomly selecting any one of the delay signals Xd1 to Xdn according to the control signal Ctrl. Here, the term "randomly select" is not limited to truly random selection, and may be pseudo-random selection. For example, the control circuit 21 may generate, based on pseudo random numbers generated by various known pseudo random number generation algorithms, the control signal Ctrl for randomly selecting any one of the delay signals Xd1 to Xdn in a pseudo manner. In addition, for example, the control circuit 21 may generate, based on random numbers generated by a hardware random number generator, the control signal Ctrl for randomly selecting any one of the delay signals Xd1 to Xdn in a pseudo manner.

In the following description, it is assumed that all the delay times of the n delay circuits 23 are $\Delta t$. That is, it is assumed that the delay time of the delay signal Xd1 is time $\Delta t$, the delay time of the delay signal Xd2 is $2 \times \Delta t$, and the delay time of the delay signal Xdn is $n \times \Delta t$. That is, it is assumed that the delay time of the delay signal Xdi is $i \times \Delta t$ for each integer i of 1 or more and n or less. However, the delay circuits 23 may have different configurations, and the delay times of the delay signals Xd1 to Xdn may be different from each other.

Figure 4:
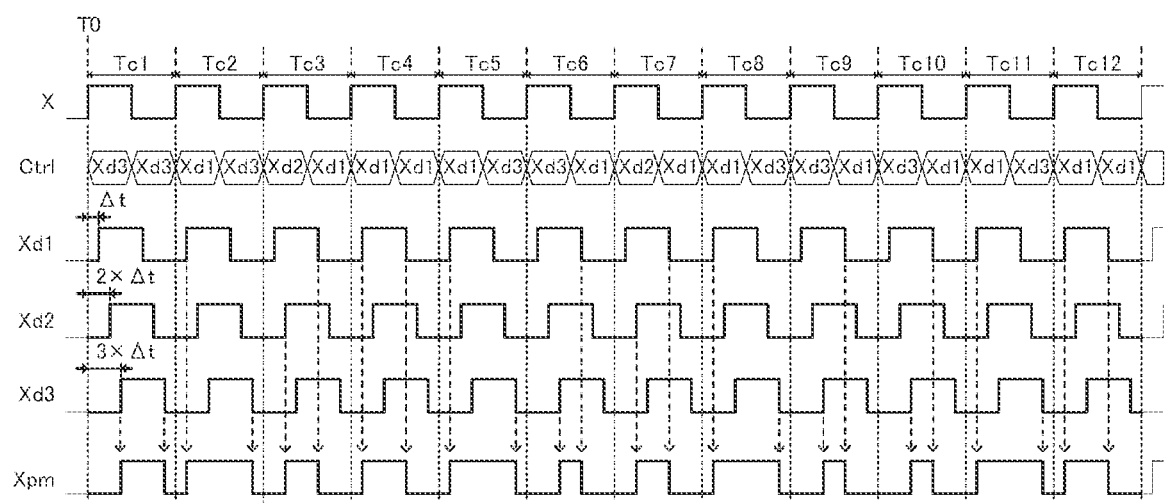
FIG. 4 is a timing chart showing an operation of the phase modulation circuit according to the first embodiment.

FIG. 4 is a timing chart showing an example of an operation of the phase modulation circuit 2. In the example of FIG. 4, the integer n is 3, and the phase modulation signal Xpm is generated based on the three delay signals Xd1, Xd2, and Xd3.

FIG. 4 shows any reference time T0 in the rise of the measurement target signal X. In a period Tc1 from the reference time T0 when the measurement target signal X rises to the next rise of the measurement target signal X, the control circuit 21 outputs the control signal Ctrl for selecting the delay signal Xd3 during a period in which the measurement target signal X is at a high level, and outputs the control signal Ctrl for selecting the delay signal Xd3 during a period in which the measurement target signal X is at a low level. Therefore, the phase modulation signal Xpm in the period Tc1 rises with a delay of time $3 \times \Delta t$ with respect to the rise of the measurement target signal X, and falls with a delay of time $3 \times \Delta t$ with respect to the fall of the measurement target signal X.

In addition, in a period Tc2 after the period Tc1 until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd3 during a period in which the measurement target signal X is at a low level. Therefore, the phase modulation signal Xpm in the period Tc2 rises with a delay of time $\Delta t$ with respect to the rise of the measurement target signal X, and falls with a delay of time $3 \times \Delta t$ with respect to the fall of the measurement target signal X.

In addition, in a period Tc3 after the period Tc2 until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd1 during a period in which the measurement target signal X is at a low level. Therefore, the phase modulation signal Xpm in the period Tc3 rises with a delay of time $2 \times \Delta t$ with respect to the rise of the measurement target signal X, and falls with a delay of time $\Delta t$ with respect to the fall of the measurement target signal X.

In addition, in a period Tc4 after the period Tc3 until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd1 during a period in which the measurement target signal X is at a low level. Therefore, the phase modulation signal Xpm in the period Tc4 rises with a delay of time $\Delta t$ with respect to the rise of the measurement target signal X, and falls with a delay of time $\Delta t$ with respect to the fall of the measurement target signal X.

As described above, in the example of FIG. 4, in the periods Tc1 to Tc4, the multiplexer 22 generates the phase modulation signal Xpm by randomly selecting any one of the three delay signals Xd1, Xd2, and Xd3 according to the control signal Ctrl. Although description is omitted, as shown in FIG. 4, in each of periods Tc5 to Tc12 after the period Tc4 until the measurement target signal X sequentially rises, the multiplexer 22 generates the phase modulation signal Xpm by randomly selecting any one of the three delay signals Xd1, Xd2, and Xd3 according to the control signal Ctrl.

Figure 5:
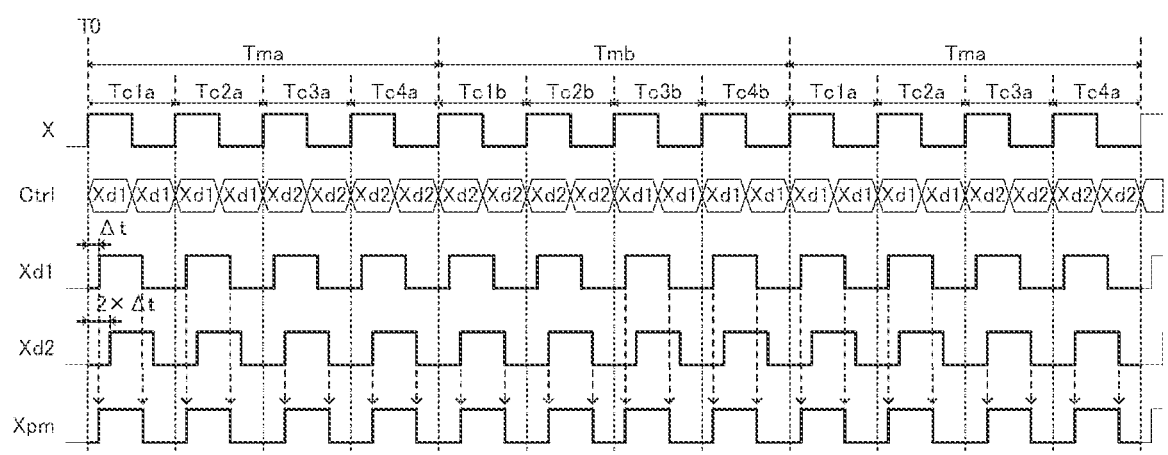
FIG. 5 is a timing chart showing an operation of a phase modulation circuit of Comparative Example A.

On the other hand, FIG. 5 is a timing chart showing an example of an operation of Comparative Example A when the multiplexer 22 generates the phase modulation signal Xpm by regularly selecting any one of the two delay signals Xd1 and Xd2.

In the example of FIG. 5, in a period Tc1a from the reference time T0 when the measurement target signal X rises to the next rise of the measurement target signal X and a period Tc2a after the period Tc1a until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd1 during a period in which the measurement target signal X is at a low level. Therefore, the phase modulation signal Xpm in the periods Tc1a and Tc2a rises with a delay of time $\Delta t$ with respect to the rise of the measurement target signal X, and falls with a delay of time $\Delta t$ with respect to the fall of the measurement target signal X.

In addition, in a period Tc3a after the period Tc2a until the next rise of the measurement target signal X and a period Tc4a after the period Tc3a until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd2 during a period in which the measurement target signal X is at a low level. Therefore, the phase modulation signal Xpm in the periods Tc3a and Tc4a rises with a delay of time $2 \times \Delta t$ with respect to the rise of the measurement target signal X, and falls with a delay of time $2 \times \Delta t$ with respect to the fall of the measurement target signal X.

In addition, in a period Tc1b after the period Tc4a until the next rise of the measurement target signal X and a period Tc2b after the period Tc1b until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd2 during a period in which the measurement target signal X is at a low level. Therefore, the phase modulation signal Xpm in the periods Tc1b and Tc2b rises with a delay of time 2×Δt with respect to the rise of the measurement target signal X, and falls with a delay of time 2×Δt with respect to the fall of the measurement target signal X.

In addition, in a period Tc3b after the period Tc2b until the next rise of the measurement target signal X and a period Tc4b after the period Tc3b until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd1 during a period in which the measurement target signal X is at a low level. Therefore, the phase modulation signal Xpm in the periods Tc3b and Tc4b rises with a delay of time Δt with respect to the rise of the measurement target signal X, and falls with a delay of time Δt with respect to the fall of the measurement target signal X.

Then, a period Tma including the periods Tc1a, Tc2a, Tc3a, and Tc4a, and a period Tmb including the periods Tc1b, Tc2b, Tc3b, and Tc4b are alternately repeated. As described above, in Comparative Example A, the multiplexer 22 generates the phase modulation signal Xpm by regularly selecting any one of the two delay signals Xd1 and Xd2 according to the control signal Ctrl with a period including the period Tma and the period Tmb as one cycle.

Figure 6:
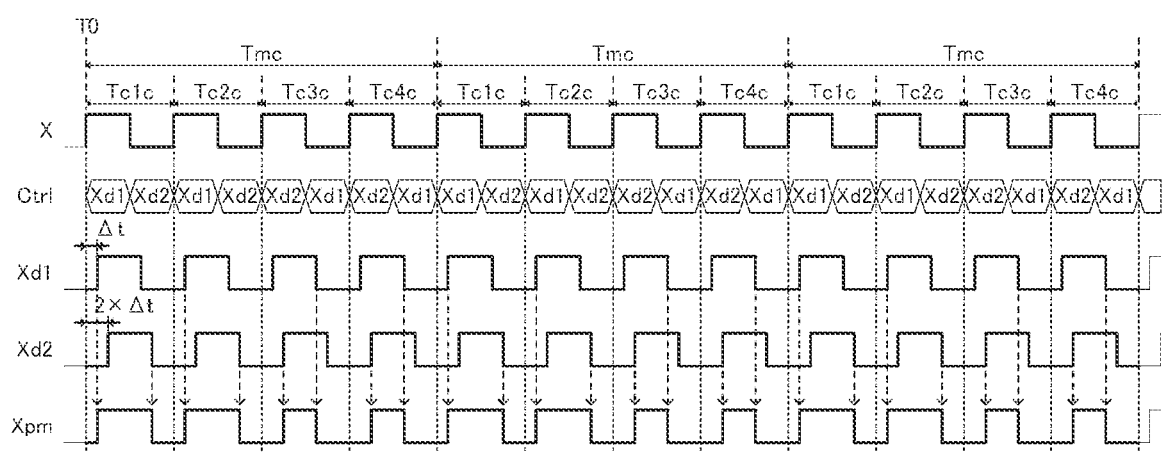
FIG. 6 is a timing chart showing an operation of a phase modulation circuit of Comparative Example B.

In addition, FIG. 6 is a timing chart showing an example of an operation of Comparative Example B when the multiplexer 22 generates the phase modulation signal Xpm by regularly selecting any one of the two delay signals Xd1 and Xd2.

In the example of FIG. 6, in a period Tc1c from the reference time T0 when the measurement target signal X rises to the next rise of the measurement target signal X and a period Tc2c after the period Tc1c until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd2 during a period in which the measurement target signal X is at a low level. Therefore, the phase modulation signal Xpm in the periods Tc1c and Tc2c rises with a delay of time Δt with respect to the rise of the measurement target signal X, and falls with a delay of time 2×Δt with respect to the fall of the measurement target signal X.

In addition, in a period Tc3c after the period Tc2c until the next rise of the measurement target signal X and a period Tc4c after the period Tc3c until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd1 during a period in which the measurement target signal X is at a low level. Therefore, the phase modulation signal Xpm in the periods Tc3c and Tc4c rises with a delay of time 2×Δt with respect to the rise of the measurement target signal X, and falls with a delay of time Δt with respect to the fall of the measurement target signal X.

Then, a period Tmc including the periods Tc1c, Tc2c, Tc3c, and Tc4c is repeated. As described above, in Comparative Example B, the multiplexer 22 generates the phase modulation signal Xpm by regularly selecting any one of the two delay signals Xd1 and Xd2 according to the control signal Ctrl with the period Tmc as one cycle.

Figure 7:
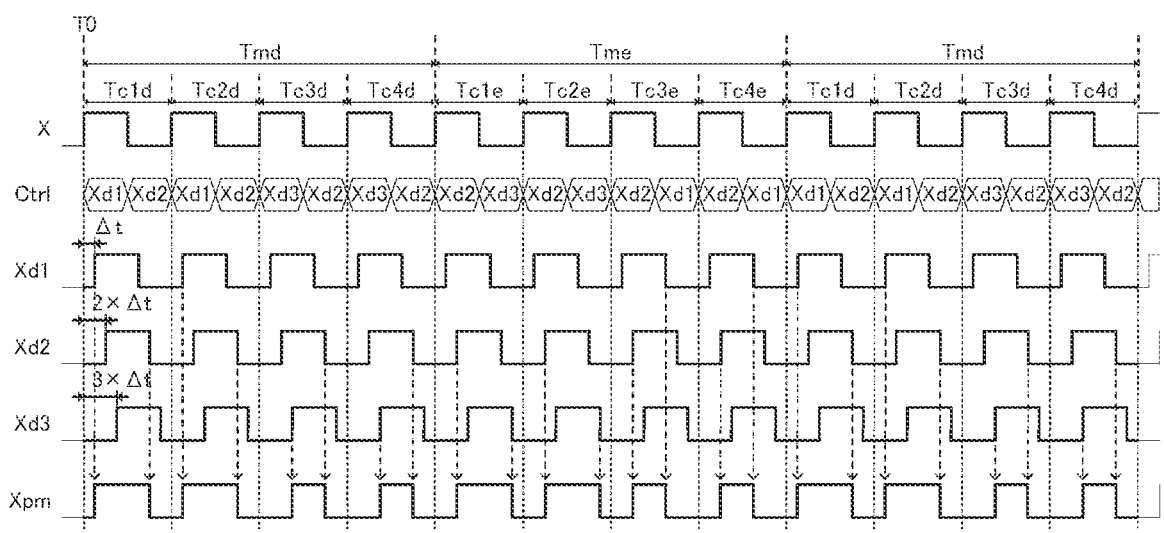
FIG. 7 is a timing chart showing an operation of a phase modulation circuit of Comparative Example C.

In addition, FIG. 7 is a timing chart showing an example of an operation of Comparative Example C when the multiplexer 22 generates the phase modulation signal Xpm by regularly selecting any one of the three delay signals Xd1, Xd2, and Xd3.

In the example of FIG. 7, in a period Tc1d from the reference time T0 when the measurement target signal X rises to the next rise of the measurement target signal X and a period Tc2d after the period Tc1d until the next rise of the measurement target signal X, the control circuit 21 outputs the control signal Ctrl for selecting the delay signal Xd1 during a period in which the measurement target signal X is at a high level, and outputs the control signal Ctrl for selecting the delay signal Xd2 during a period in which the measurement target signal X is at a low level. Therefore, the phase modulation signal Xpm in the periods Tc1d and Tc2d rises with a delay of time Δt with respect to the rise of the measurement target signal X, and falls with a delay of time 2×Δt with respect to the fall of the measurement target signal X.

In addition, in a period Tc3d after the period Tc2d until the next rise of the measurement target signal X and a period Tc4d after the period Tc3d until the next rise of the measurement target signal X, the control circuit 21 outputs the control signal Ctrl for selecting the delay signal Xd3 during a period in which the measurement target signal X is at a high level, and outputs the control signal Ctrl for selecting the delay signal Xd2 during a period in which the measurement target signal X is at a low level. Therefore, the phase modulation signal Xpm in the periods Tc3d and Tc4d rises with a delay of time 3×Δt with respect to the rise of the measurement target signal X, and falls with a delay of time 2×Δt with respect to the fall of the measurement target signal X.

In addition, in a period Tc1e after the period Tc4d until the next rise of the measurement target signal X and a period Tc2e after the period Tc1e until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd3 during a period in which the measurement target signal X is at a low level. Therefore, the phase modulation signal Xpm in the periods Tc1e and Tc2e rises with a delay of time 2×Δt with respect to the rise of the measurement target signal X, and falls with a delay of time 3×Δt with respect to the fall of the measurement target signal X.

In addition, in a period Tc3e after the period Tc2e until the next rise of the measurement target signal X and a period Tc4e after the period Tc3e until the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd1 during a period in which the measurement target signal X is at a low level. Therefore, the phase modulation signal Xpm in the periods Tc3e and Tc4e rises with a delay of time 2×Δt with respect to the rise of the measurement target signal X, and falls with a delay of time Δt with respect to the fall of the measurement target signal X.

Then, a period Tmd including the periods Tc1d, Tc2d, Tc3d, and Tc4d, and a period Tme including the periods Tc1e, Tc2e, Tc3e, and Tc4e are alternately repeated. As described above, in Comparative Example C, the multiplexer 22 generates the phase modulation signal Xpm by regularly selecting any one of the three delay signals Xd1, Xd2, and Xd3 according to the control signal Ctrl with a period including the period Tmd and the period Tme as one cycle.

Figure 8:
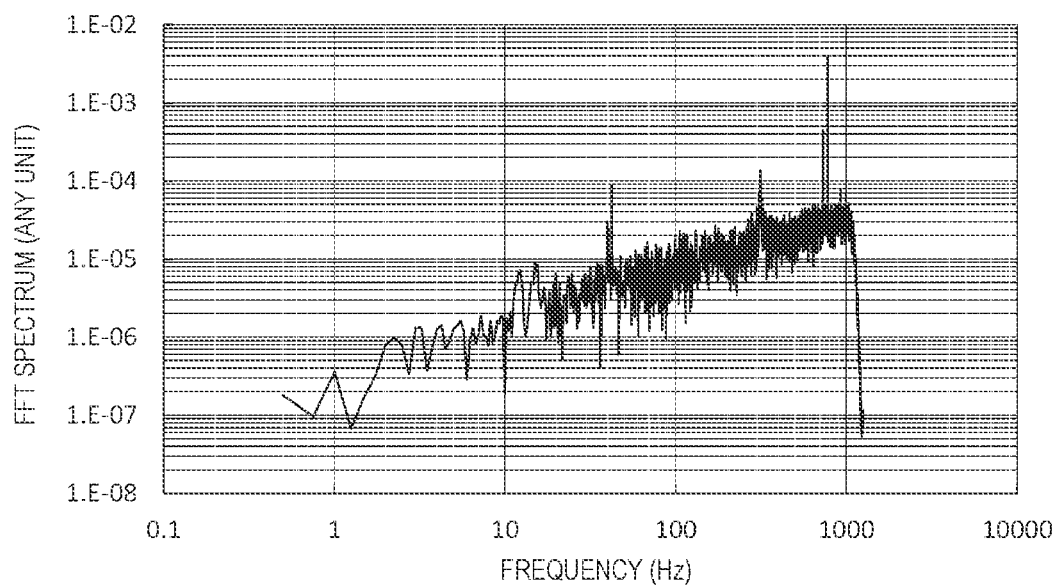
FIG. 8 is a diagram showing an example of a frequency spectrum of a signal obtained by sampling a measurement target signal with a reference signal.

Here, in a signal obtained by sampling the measurement target signal X with the reference signal CLK, periodic quantization noise called an idle tone is generated, and when a decimal part of a frequency ratio between the measurement target signal X and the reference signal CLK is close to 0, a large idle tone is generated. FIG. 8 is a diagram showing an example of a frequency spectrum, which is obtained by performing fast Fourier transform on a signal obtained by sampling the measurement target signal X with the reference signal CLK, when the decimal part of the frequency ratio between the measurement target signal X and the reference signal CLK is close to 0. In the example of FIG. 8, a peak due to the idle tone occurs in the vicinity of 300 Hz or 700 Hz to 800 Hz. In FIG. 8, a peak in the vicinity of 40 Hz is caused by a signal to be measured, and when an upper limit of a measurement band is 300 Hz or more, the accuracy of the output signal OUT may decrease due to the influence of the idle tone.

Figure 9:
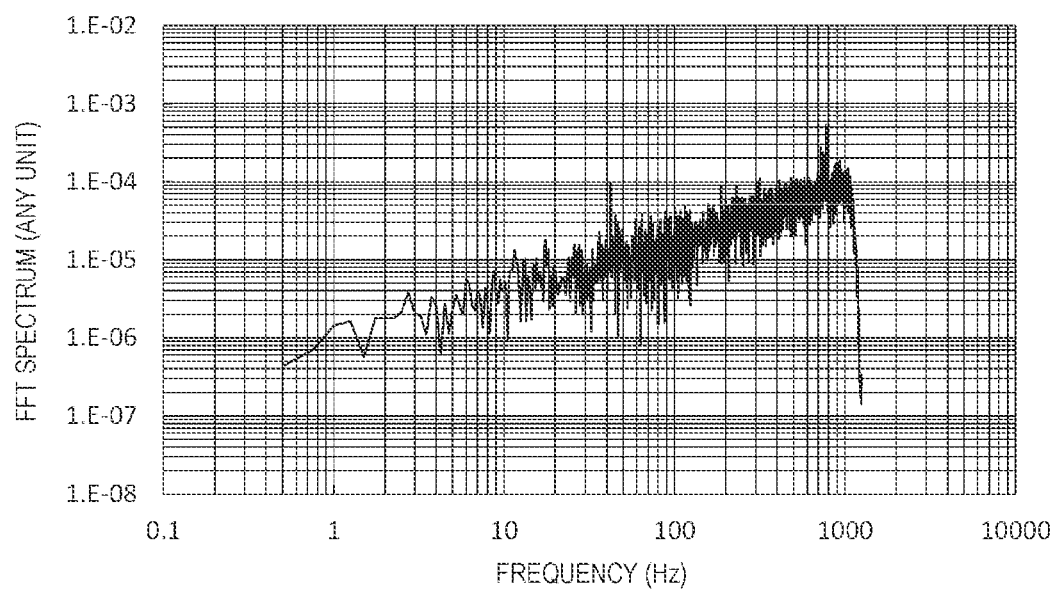
FIG. 9 is a diagram showing an example of a frequency spectrum of a signal obtained by sampling a phase modulation signal with a reference signal in Comparative Example A.

On the other hand, FIG. 9 is a diagram showing an example of a frequency spectrum, which is obtained by performing fast Fourier transform on a signal obtained by sampling the phase modulation signal Xpm obtained in Comparative Example A with the reference signal CLK. In the example of FIG. 9, a noise level of the base increases, but the peak due to the idle tone occurs in the vicinity of 300 Hz or 700 Hz to 800 Hz is reduced. However, a peak due to the period of the phase modulation signal Xpm is generated in the vicinity of 200 Hz. Although not shown, a frequency spectrum, which is obtained by performing fast Fourier transform on a signal obtained by sampling the phase modulation signal Xpm obtained in Comparative Example B or Comparative Example C with the reference signal CLK, also exhibits the same tendency as in FIG. 9.

Figure 10:
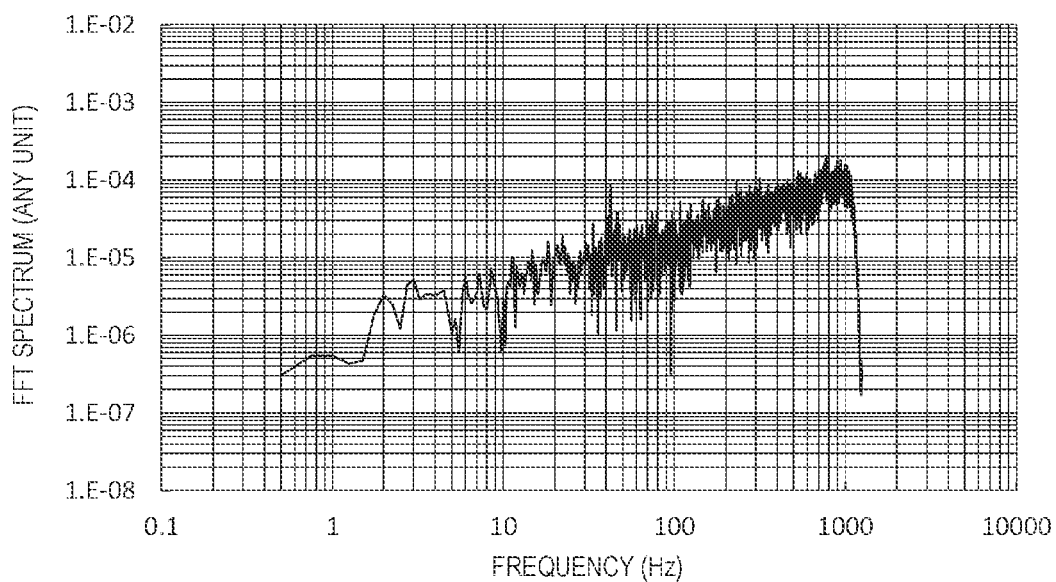
FIG. 10 is a diagram showing an example of a frequency spectrum of a signal obtained by sampling a phase modulation signal with a reference signal according to the first embodiment.

On the other hand, FIG. 10 is a diagram showing an example of a frequency spectrum, which is obtained by performing fast Fourier transform on a signal obtained by sampling the phase modulation signal Xpm obtained in the present embodiment with the reference signal CLK. In the example of FIG. 10, the noise level of the base is about the same as that of FIG. 9, but the peak due to the idle tone occurs in the vicinity of 300 Hz or 700 Hz to 800 Hz and the peak due to the period of the phase modulation signal Xpm are hardly generated.

Figure 11:
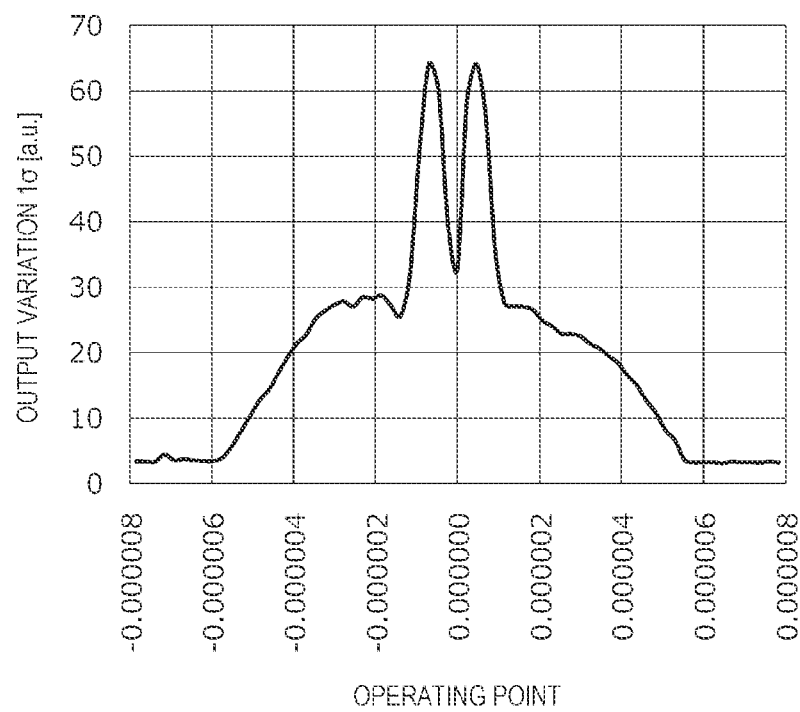
FIG. 11 is a diagram showing an example of variations in an output signal when a measurement target signal is not modulated.
Figure 12:
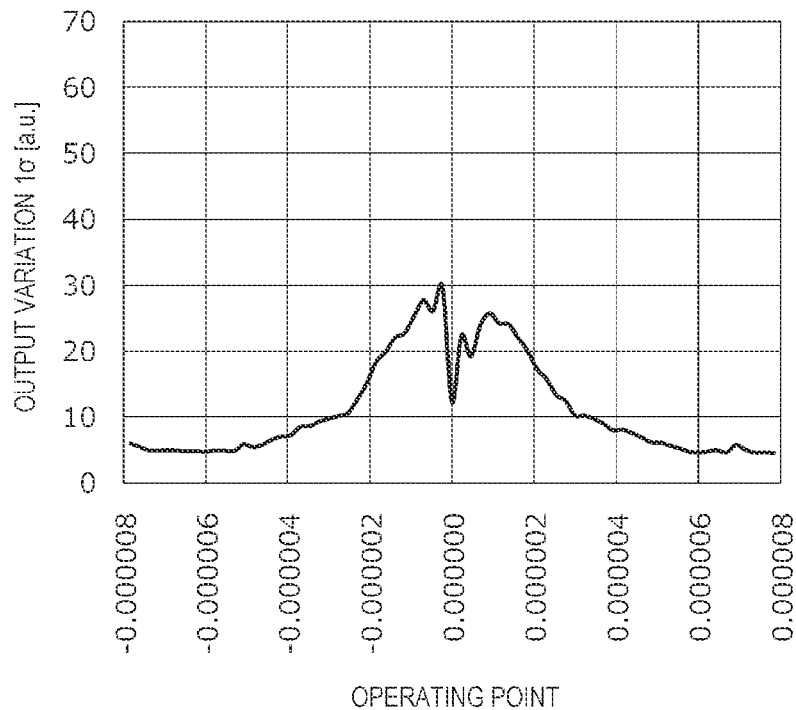
FIG. 12 is a diagram showing an example of variations in an output signal in Comparative Example A.
Figure 13:
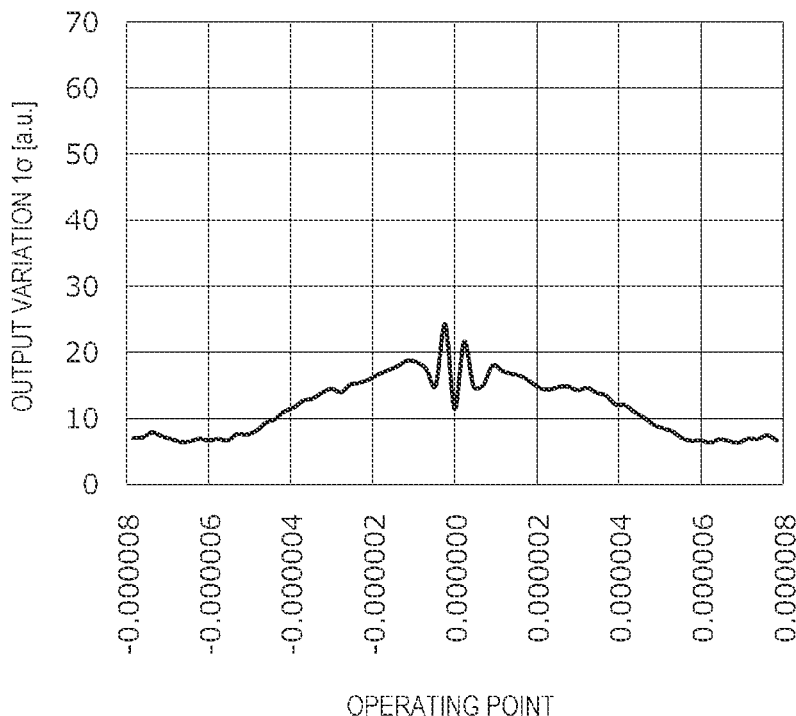
FIG. 13 is a diagram showing an example of variations in an output signal in Comparative Example B.
Figure 14:
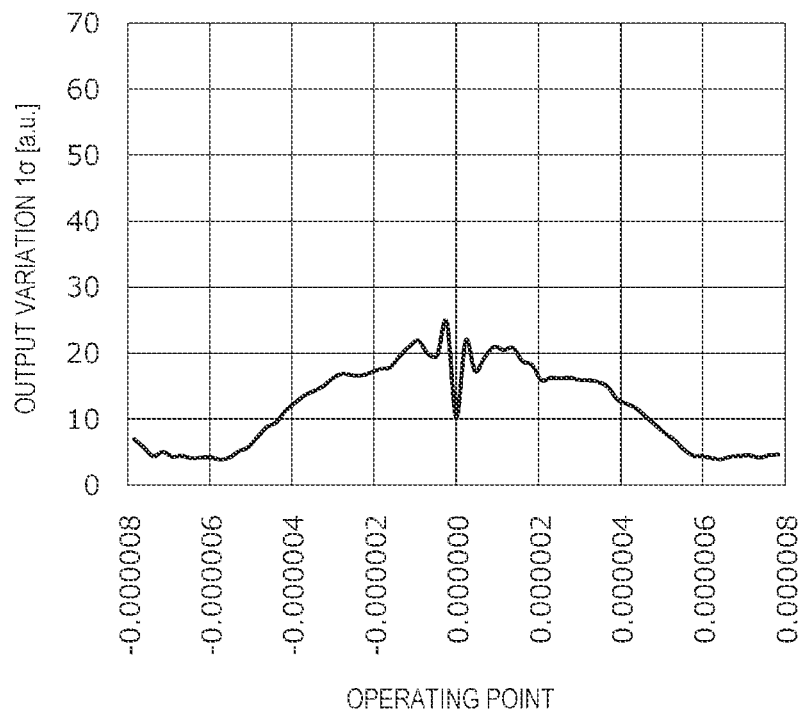
FIG. 14 is a diagram showing an example of variations in an output signal in Comparative Example C.
Figure 15:
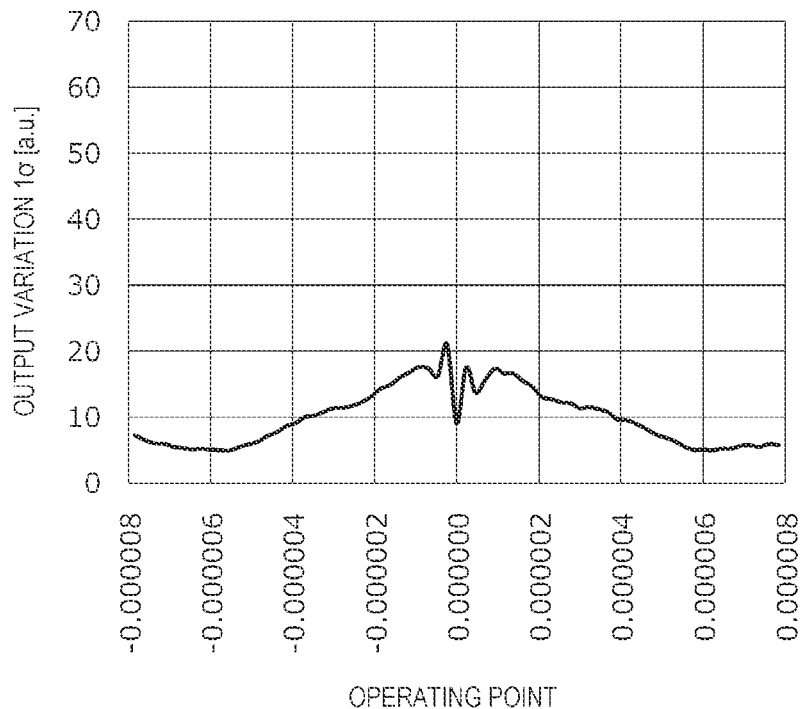
FIG. 15 is a diagram showing an example of variations in an output signal according to the first embodiment.

FIGS. 11 to 15 are diagrams showing examples of a variation 1σ of the output signal OUT obtained when a modulation method of the measurement target signal X is changed. FIG. 11 corresponds to a case where the phase modulation signal Xpm is the same as the measurement target signal X, that is, a case where the measurement target signal X is not modulated. FIG. 12 corresponds to a case where the phase modulation signal Xpm obtained in Comparative Example A is used. FIG. 13 corresponds to a case where the phase modulation signal Xpm obtained in Comparative Example B is used. FIG. 14 corresponds to a case where the phase modulation signal Xpm obtained in Comparative Example C is used. FIG. 15 corresponds to a case where the phase modulation signal Xpm obtained in the present embodiment is used. In FIGS. 11 to 15, the vertical axis represents a variation, and the horizontal axis represents an operating point, that is, a decimal part when the frequency of the reference signal CLK is divided by the frequency of the measurement target signal X. Specifically, a range of the operating point, when the frequency of the reference signal CLK is 32 MHz and the frequency of the measurement target signal X is swept around 120300.75 Hz, is a range of the horizontal axis. Since 32 MHz/120300.75 Hz≈266, a case where the frequency of the measurement target signal X is about 120300.75 Hz corresponds to an operating point 0.

In the example of FIG. 11, a large variation occurs before and after the operating point 0 due to the influence of the idle tone. In the examples of FIGS. 12, 13, and 14, as compared with the example of FIG. 11, the influence of the idle tone is reduced, and the variation before and after the operating point 0 is reduced. In the example of FIG. 15, as compared with the examples of FIGS. 12, 13, and 14, the influence of the idle tone is further reduced, the variation before and after the operating point 0 is further reduced, and the output signal OUT with high accuracy is obtained.

As described above, in the frequency delta-sigma modulation signal output circuit 1 according to the first embodiment, the phase modulation circuit 2 generates the n delay signals Xd1 to Xdn obtained by delaying the measurement target signal X, selects any one of the n delay signals Xd1 to Xdn in synchronization with the measurement target signal X, thereby generating the phase modulation signal Xpm. The frequency ratio digital conversion circuit 3 generates the frequency delta-sigma modulation signal Sfdsm using the reference signal CLK and the phase modulation signal Xpm. Accordingly, since the phase of the phase modulation signal Xpm changes, an idle tone included in a signal obtained by sampling one of the reference signal CLK and the phase modulation signal Xpm with the other is reduced, and a signal component caused by the idle tone included in the frequency delta-sigma modulation signal Sfdsm is reduced. In addition, in the frequency delta-sigma modulation signal output circuit 1 according to the first embodiment, since the phase modulation circuit 2 generates the phase modulation signal Xpm by randomly selecting any one of the n delay signals Xd1 to Xdn, the phase of the phase modulation signal Xpm irregularly changes. Therefore, the frequency delta-sigma modulation signal Sfdsm does not include a signal component of a predetermined frequency that can be generated when any one of the n delay signals Xd1 to Xdn is regularly selected. Therefore, according to the frequency delta-sigma modulation signal output circuit 1 of the first embodiment, a noise component included in the frequency delta-sigma modulation signal Sfdsm can be reduced.

In addition, according to the frequency delta-sigma modulation signal output circuit 1 of the first embodiment, the low-pass filter circuit 4 provided at the subsequent stage of the frequency ratio digital conversion circuit 3 can obtain the output signal OUT which is a frequency delta-sigma modulation signal having a further reduced noise component. In addition, the frequency delta-sigma modulation signal Sfdsm generated by the frequency-ratio digital conversion circuit 3 does not include a signal component of a predetermined frequency that can be generated when any one of the n delay signals Xd1 to Xdn is regularly selected. Therefore, a cutoff frequency of the low-pass filter circuit 4 is less restricted, and the degree of freedom in design is high.

1-2. Second Embodiment

Hereinafter, in the frequency delta-sigma modulation signal output circuit 1 according to a second embodiment, the same components as those in the first embodiment are denoted by the same reference numerals, the description overlapping with the first embodiment is omitted or simplified, and contents different from those in the first embodiment will be mainly described.

Since a configuration of the frequency delta-sigma modulation signal output circuit 1 according to the second embodiment is the same as that of FIG. 1, the illustration and description thereof will be omitted. In the frequency delta-sigma modulation signal output circuit 1 according to the second embodiment, a function and a configuration of the phase modulation circuit 2 are different from those of the first embodiment.

In the second embodiment, the phase modulation circuit 2 generates n delay signals obtained by delaying the measurement target signal X, and generates the phase modulation signal Xpm by randomly selecting any one of the measurement target signal X and the n delay signals in synchronization with the measurement target signal X. n is an integer of 1 or more, and when n is 2 or more, delay times of the n delay signals with respect to the measurement target signal X are different from each other.

As in the first embodiment, the frequency ratio digital conversion circuit 3 generates the frequency delta-sigma modulation signal Sfdsm using the reference signal CLK and the phase modulation signal Xpm. Further, the low-pass filter circuit 4, which is a filter circuit provided at the subsequent stage of the frequency ratio digital conversion circuit 3, extracts a low-frequency component included in the frequency delta-sigma modulation signal Sfdsm, and outputs the extracted low-frequency component as the output signal OUT.

Figure 16:
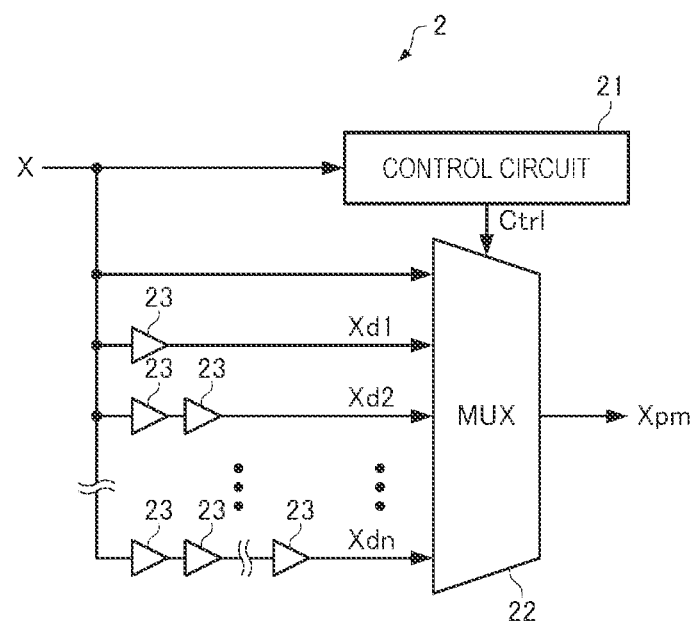
FIG. 16 is a diagram showing a configuration example of a phase modulation circuit according to a second embodiment.

FIG. 16 is a diagram showing a configuration example of the phase modulation circuit 2 according to the second embodiment. As shown in FIG. 16, the phase modulation circuit 2 includes the control circuit 21, the multiplexer 22, and the plurality of delay circuits 23.

The measurement target signal X is input to the control circuit 21. The control circuit 21 generates the control signal Ctrl synchronized with the rise and fall of the measurement target signal X.

The measurement target signal X, the n delay signals Xd1 to Xdn, and the control signal Ctrl are input to the multiplexer 22. In the example of FIG. 16, the delay signal Xd1 is a signal obtained by passing the measurement target signal X through one delay circuit 23, and the delay signal Xd2 is a signal obtained by passing the measurement target signal X through two delay circuits 23. The delay signal Xdn is a signal obtained by passing the measurement target signal X through n delay circuits 23. That is, for each integer i of 1 or more and n or less, the delay signal Xdi is a signal obtained by passing the measurement target signal X through i delay circuits 23. For example, assuming that the delay times of the n delay circuits 23 are substantially equal to each other, the delay times of the n delay signals Xd1 to Xdn with respect to the measurement target signal X are different from each other.

The multiplexer 22 generates the phase modulation signal Xpm by randomly selecting any one of the measurement target signal X and the delay signals Xd1 to Xdn according to the control signal Ctrl.

In the following description, it is assumed that all the delay times of the n delay circuits 23 are $\Delta t$. That is, it is assumed that the delay time of the delay signal Xd1 is time $\Delta t$, the delay time of the delay signal Xd2 is $2\times\Delta t$, and the delay time of the delay signal Xdn is $n\times\Delta t$. That is, it is assumed that the delay time of the delay signal Xdi is $i\times\Delta t$ for each integer i of 1 or more and n or less. However, the delay circuits 23 may have different configurations, and the delay times of the delay signals Xd1 to Xdn may be different from each other.

Figure 17:
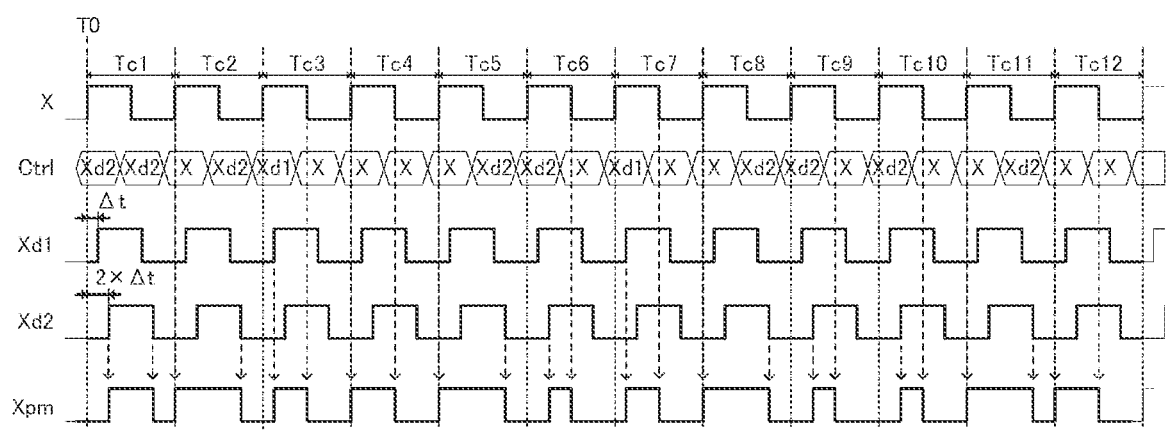
FIG. 17 is a timing chart showing an operation of the phase modulation circuit according to the second embodiment.

FIG. 17 is a timing chart showing an example of an operation of the phase modulation circuit 2. In the example of FIG. 17, the integer n is 2, and the phase modulation signal Xpm is generated based on the measurement target signal X and the two delay signals Xd1 and Xd2.

FIG. 17 shows any reference time T0 in the rise of the measurement target signal X. In the period Tc1 from the reference time T0 when the measurement target signal X rises to the next rise of the measurement target signal X, the control circuit 21 outputs the control signal Ctrl for selecting the delay signal Xd2 during a period in which the measurement target signal X is at a high level, and outputs the control signal Ctrl for selecting the delay signal Xd2 during a period in which the measurement target signal X is at a low level. Therefore, the phase modulation signal Xpm in the period Tc1 rises with a delay of time $2\times\Delta t$ with respect to the rise of the measurement target signal X, and falls with a delay of time $2\times\Delta t$ with respect to the fall of the measurement target signal X.

In addition, in the period Tc2 after the period Tc1 until the next rise of the measurement target signal X, the control circuit 21 outputs the control signal Ctrl for selecting the measurement target signal X during a period in which the measurement target signal X is at a high level, and outputs the control signal Ctrl for selecting the delay signal Xd2 during a period in which the measurement target signal X is at a low level. Therefore, the phase modulation signal Xpm in the period Tc2 rises with almost no delay with respect to the rise of the measurement target signal X, and falls with a delay of time $2\times\Delta t$ with respect to the fall of the measurement target signal X.

In addition, in the period Tc3 after the period Tc2 until the next rise of the measurement target signal X, the control circuit 21 outputs the control signal Ctrl for selecting the delay signal Xd1 during a period in which the measurement target signal X is at a high level, and outputs the control signal Ctrl for selecting the measurement target signal X during a period in which the measurement target signal X is at a low level. Therefore, the phase modulation signal Xpm in the period Tc3 rises with a delay of time $\Delta t$ with respect to the rise of the measurement target signal X, and falls with almost no delay with respect to the fall of the measurement target signal X.

In addition, in the period Tc4 after the period Tc3 until the next rise of the measurement target signal X, the control circuit 21 outputs the control signal Ctrl for selecting the measurement target signal X during a period in which the measurement target signal X is at a high level, and outputs the control signal Ctrl for selecting the measurement target signal X during a period in which the measurement target signal X is at a low level. Therefore, the phase modulation signal Xpm in the period Tc4 rises with almost no delay with respect to the rise of the measurement target signal X, and falls with almost no delay with respect to the fall of the measurement target signal X.

As described above, in the example of FIG. 17, in the periods Tc1 to Tc4, the multiplexer 22 generates the phase modulation signal Xpm by randomly selecting any one of the measurement target signal X and the two delay signals Xd1 and Xd2 according to the control signal Ctrl. Although description is omitted, as shown in FIG. 17, in each of the periods Tc5 to Tc12 after the period Tc4 until the measurement target signal X sequentially rises, the multiplexer 22 generates the phase modulation signal Xpm by randomly selecting any one of the measurement target signal X and the two delay signals Xd1 and Xd2 according to the control signal Ctrl.

As described above, in the frequency delta-sigma modulation signal output circuit 1 according to the second embodiment, the phase modulation circuit 2 generates the n delay signals Xd1 to Xdn obtained by delaying the measurement target signal X, selects any one of the measurement target signal X and the n delay signals Xd1 to Xdn in synchronization with the measurement target signal X, thereby generating the phase modulation signal Xpm. The frequency ratio digital conversion circuit 3 generates the frequency delta-sigma modulation signal Sfdsm using the reference signal CLK and the phase modulation signal Xpm. Accordingly, since the phase of the phase modulation signal Xpm changes, an idle tone included in a signal obtained by sampling one of the reference signal CLK and the phase modulation signal Xpm with the other is reduced, and a signal component caused by the idle tone included in the frequency delta-sigma modulation signal Sfdsm is reduced. In addition, in the frequency delta-sigma modulation signal output circuit 1 according to the second embodiment, since the phase modulation circuit 2 generates the phase modulation signal Xpm by randomly selecting any one of the measurement target signal X and the n delay signals Xd1 to Xdn, the phase of the phase modulation signal Xpm irregularly changes. Therefore, the frequency delta-sigma modulation signal Sfdsm does not include a signal component of a predetermined frequency that can be generated when any one of the measurement target signal X and the n delay signals Xd1 to Xdn is regularly selected. Therefore, according to the frequency delta-sigma modulation signal output circuit 1 of the second embodiment, a noise component included in the frequency delta-sigma modulation signal Sfdsm can be reduced.

In addition, according to the frequency delta-sigma modulation signal output circuit 1 of the second embodiment, the low-pass filter circuit 4 provided at the subsequent stage of the frequency ratio digital conversion circuit 3 can obtain the output signal OUT which is a frequency delta-sigma modulation signal having a further reduced noise component. In addition, the frequency delta-sigma modulation signal Sfdsm generated by the frequency-ratio digital conversion circuit 3 does not include a signal component of a predetermined frequency that can be generated when any one of the measurement target signal X and the n delay signals Xd1 to Xdn is regularly selected. Therefore, a cutoff frequency of the low-pass filter circuit 4 is less restricted, and the degree of freedom in design is high.

In addition, in the frequency delta-sigma modulation signal output circuit 1 according to the second embodiment, since the measurement target signal X is included in a target selected by the phase modulation circuit 2, a total number of the delay signals Xd1 to Xdn can be reduced by one as compared with the first embodiment, and the frequency delta-sigma modulation signal output circuit 1 can be miniaturized.

1-3. Third Embodiment

Hereinafter, in the frequency delta-sigma modulation signal output circuit 1 according to a third embodiment, the same components as those in the first embodiment or the second embodiment are denoted by the same reference numerals, the description overlapping with the first embodiment or the second embodiment is omitted or simplified, and contents different from those in the first embodiment or the second embodiment will be mainly described.

Since a configuration of the frequency delta-sigma modulation signal output circuit 1 according to the third embodiment is the same as that of FIG. 1, the illustration and description thereof will be omitted. In the frequency delta-sigma modulation signal output circuit 1 according to the third embodiment, a function and a configuration of the frequency ratio digital conversion circuit 3 are different from those of the first embodiment and the second embodiment. The phase modulation circuit 2 is configured, for example, as shown in FIG. 3 or 16, and the function thereof is the same as that of the first embodiment or the second embodiment.

In the third embodiment, the frequency ratio digital conversion circuit 3 includes a plurality of frequency delta-sigma modulation circuits coupled in parallel, and generates the frequency delta-sigma modulation signal Sfdsm based on output signals of the plurality of frequency delta-sigma modulation circuits.

Figure 18:
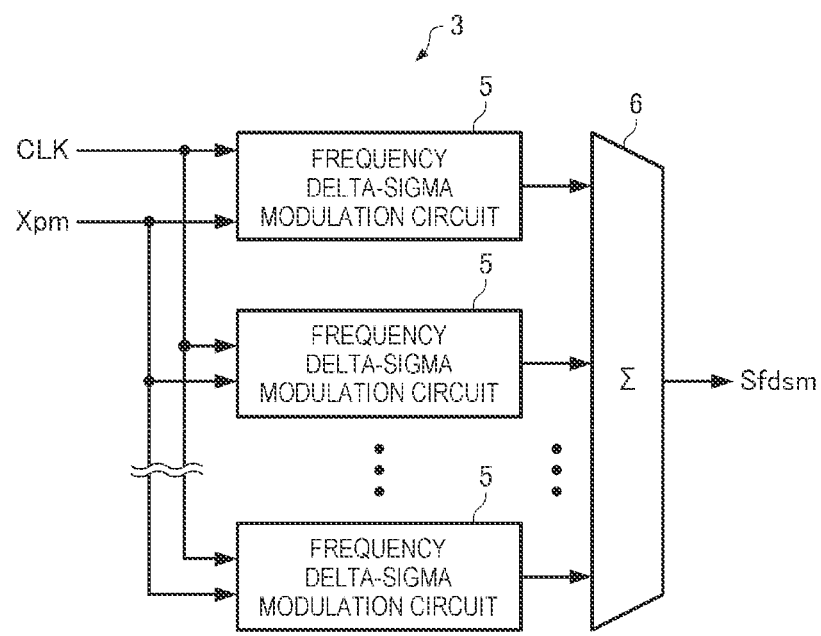
FIG. 18 is a diagram showing a configuration example of a frequency ratio digital conversion circuit according to a third embodiment.

FIG. 18 is a diagram showing a configuration example of the frequency ratio digital conversion circuit 3 according to the third embodiment. As shown in FIG. 18, the frequency ratio digital conversion circuit 3 includes a plurality of frequency delta-sigma modulation circuits 5 and an adder 6.

The reference signal CLK and the phase modulation signal Xpm output from the phase modulation circuit 2 are input to each of the plurality of frequency delta-sigma modulation circuits 5.

The frequency delta-sigma modulation circuit 5 generates and outputs a frequency delta-sigma modulation signal indicating a timing of a rising edge or a falling edge of the received phase modulation signal Xpm. Since a configuration of the frequency delta-sigma modulation circuit 5 is the same as that of FIG. 2, the illustration and description thereof will be omitted.

Output signals of the plurality of frequency delta-sigma modulation circuits 5 are input to the adder 6, and the adder 6 adds the plurality of received signals to output the frequency delta-sigma modulation signal Sfdsm.

The frequency delta-sigma modulation signal Sfdsm is input to the low-pass filter circuit 4. The low-pass filter circuit 4 extracts a low-frequency component from the signal output from the adder 6, and outputs the low-frequency component as the output signal OUT.

According to the frequency delta-sigma modulation signal output circuit 1 of the third embodiment described above, the same effects as those of the first embodiment or the second embodiment can be obtained.

Further, according to the frequency delta-sigma modulation signal output circuit 1 of the third embodiment, since the frequency delta-sigma modulation signal output circuit 1 adds the output signals of the plurality of frequency delta-sigma modulation circuits 5 coupled in parallel and generates the frequency delta-sigma modulation signal Sfdsm, a signal component caused by an idle tone included in the frequency delta-sigma modulation signal Sfdsm can be smoothed, and a noise component included in the frequency delta-sigma modulation signal Sfdsm can be further reduced.

In the present embodiment, a phase adjustment unit such as a delay circuit that shifts the phase of at least one of the received reference signal CLK and the measurement target signal X may be provided between the plurality of frequency delta-sigma modulation circuits 5. In this case, there is a form in which the phase of only the reference signal CLK is shifted, a form in which the phase of only the measurement target signal X is shifted, and a form in which the phases of the reference signal CLK and the measurement target signal X are shifted. With this configuration, the signal component caused by the idle tone included in the frequency delta-sigma modulation signal Sfdsm is more efficiently smoothed, and the noise component included in the frequency delta-sigma modulation signal Sfdsm can be further reduced.

1-4. Fourth Embodiment

Hereinafter, in the frequency delta-sigma modulation signal output circuit 1 according to a fourth embodiment, since the same components as those in any one of the first embodiment to the third embodiment are denoted by the same reference numerals, the description overlapping with any one of the first embodiment to the third embodiment is omitted or simplified, and contents different from those in any one of the first embodiment to the third embodiment will be mainly described.

Figure 19:
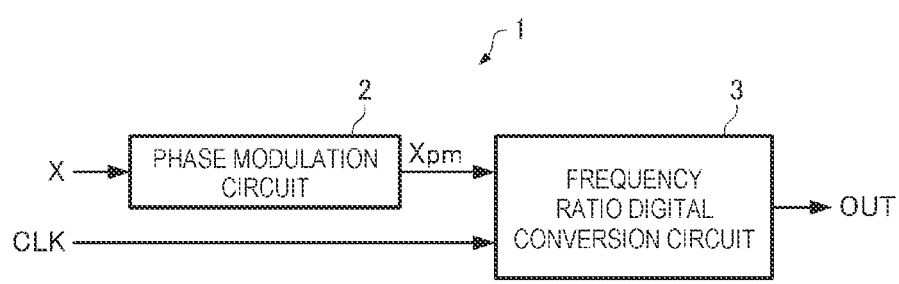
FIG. 19 is a block diagram showing a configuration example of a frequency delta-sigma modulation signal output circuit according to a fourth embodiment.

FIG. 19 is a block diagram showing a configuration of the frequency delta-sigma modulation signal output circuit 1 according to the fourth embodiment. As shown in FIG. 19, the frequency delta-sigma modulation signal output circuit 1 according to the fourth embodiment includes the phase modulation circuit 2 and the frequency ratio digital conversion circuit 3. In the frequency delta-sigma modulation signal output circuit 1 according to the fourth embodiment, a function and a configuration of the frequency ratio digital conversion circuit 3 are different from those of the first embodiment to the third embodiment. The phase modulation circuit 2 is configured, for example, as shown in FIG. 3 or 16, and the function thereof is the same as that of any one of the first embodiment to the third embodiment.

In the fourth embodiment, the frequency ratio digital conversion circuit 3 generates a time digital value corresponding to a phase difference between the reference signal CLK and the phase modulation signal Xpm, and generates a frequency delta-sigma modulation signal based on the time digital value. The frequency delta-sigma modulation signal output circuit 1 outputs the frequency delta-sigma modulation signal generated by the frequency ratio digital conversion circuit 3 as the output signal OUT.

As shown in FIG. 19, the frequency delta-sigma modulation signal output circuit 1 according to the fourth embodiment may not include the low-pass filter circuit 4, unlike the first embodiment to the third embodiment.

Figure 20:
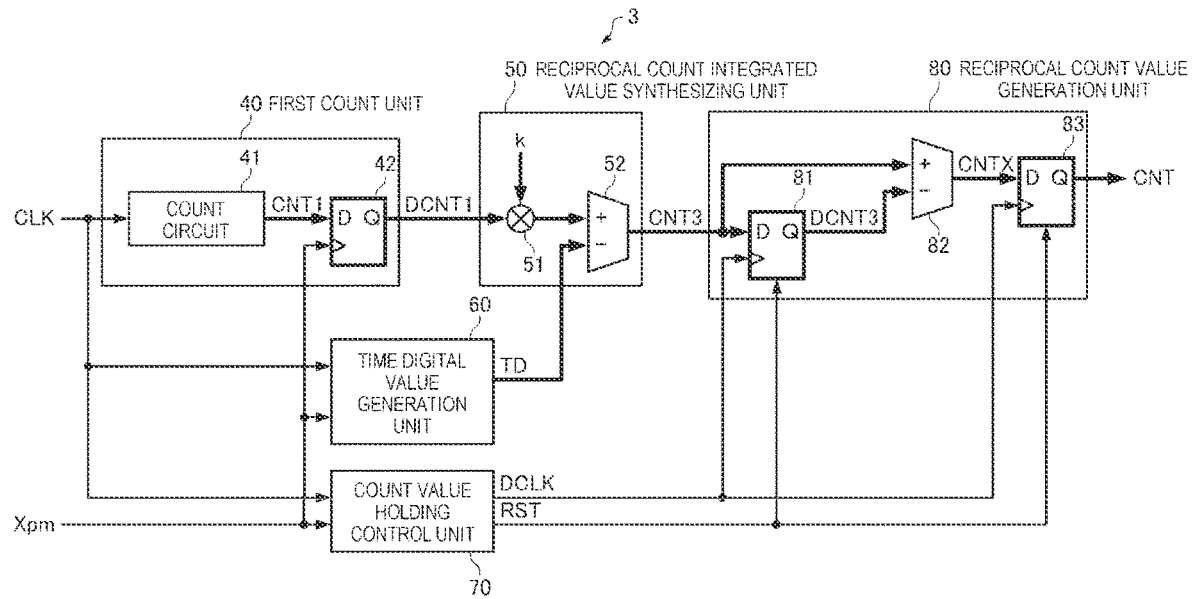
FIG. 20 is a diagram showing a configuration example of a frequency ratio digital conversion circuit according to the fourth embodiment.

FIG. 20 is a diagram showing a configuration example of the frequency ratio digital conversion circuit 3 according to the fourth embodiment. As shown in FIG. 20, the frequency ratio digital conversion circuit 3 according to the fourth embodiment includes a count circuit 41, a D flip-flop circuit 42, a multiplier 51, a subtractor 52, a time digital value generation unit 60, a count value holding control unit 70, a D flip-flop circuit 81, a subtractor 82, and a D flip-flop circuit 83. Although only one D flip-flop circuit 42, only one D flip-flop circuit 81, and only one D flip-flop circuit 83 are shown in FIG. 20 for simplification of illustration, actually, there are L D flip-flop circuits 42, M D flip-flop circuits 81, and N D flip-flop circuits 83.

The count circuit 41 counts the number of edges of the reference signal CLK. In the present embodiment, the count circuit 41 counts the number of rising edges of the reference signal CLK and outputs an L-bit count value CNT1.

The L D flip-flop circuits 42 take in and hold the L-bit count value CNT1 in synchronization with the phase modulation signal Xpm. In the present embodiment, the L D flip-flop circuits 42 take in the L-bit count value CNT1 and hold the L-bit count value CNT1 as an L-bit count value DCNT1 in synchronization with the rising edge and the falling edge of the phase modulation signal Xpm. Specifically, the L D flip-flop circuits 42 take in the count value CNT1 when the rising edge of the phase modulation signal Xpm arrives, and hold the count value CNT1 as the count value DCNT1 until the falling edge of the phase modulation signal Xpm arrives. In addition, the L D flip-flop circuits 42 take in the count value CNT1 when the falling edge of the phase modulation signal Xpm arrives, and hold the count value CNT1 as the count value DCNT1 until the rising edge of the phase modulation signal Xpm arrives.

The count circuit 41 and the L D flip-flop circuits 42 constitute a first count unit 40 that counts edges of the reference signal CLK in synchronization with the phase modulation signal Xpm and generates the count value DCNT1.

The time digital value generation unit 60 generates a time digital value TD corresponding to the phase difference between the reference signal CLK and the phase modulation signal Xpm. In the present embodiment, the time digital value generation unit 60 generates an M-bit time digital value TD corresponding to a phase difference between the rising edge of the reference signal CLK and the rising edge of the phase modulation signal Xpm, and generates an M-bit time digital value TD corresponding to a phase difference between the rising edge of the reference signal CLK and the falling edge of the phase modulation signal Xpm. The time digital value generation unit 60 will be described in detail later.

The count value holding control unit 70 generates a clock signal DCLK and a reset signal RST based on the reference signal CLK and the phase modulation signal Xpm. For example, the count value holding control unit 70 generates the clock signal DCLK that becomes a high pulse when the rising edge of the reference signal CLK arrives a predetermined number of times, for example, eight times after the phase modulation signal Xpm changes from a low level to a high level or from the high level to the low level. In addition, for example, the count value holding control unit 70 generates the reset signal RST that becomes a high pulse when the first rising edge of the reference signal CLK arrives after the phase modulation signal Xpm changes from the low level to the high level.

The multiplier 51 multiplies the L-bit count value DCNT1 by an integer k. That is, the multiplier 51 outputs an M-bit value that is k times the count value DCNT1. When the integer k is the n-th power of 2, the multiplier 51 can be implemented as a simple circuit that shifts the count value DCNT1 by n bits.

The subtractor 52 subtracts the M-bit time digital value TD from the M-bit value output from the multiplier 51, and outputs an M-bit count value CNT3.

The multiplier 51 and the subtractor 52 constitute a reciprocal count integrated value synthesizing unit 50 that outputs a difference between the integer k times the count value DCNT1 generated by the first count unit 40 and the time digital value TD generated by the time digital value generation unit 60.

The M D flip-flop circuits 81 take in and hold the M-bit count value CNT3 in synchronization with the clock signal DCLK. In the present embodiment, when the reset signal RST is at the low level and the rising edge of the clock signal DCLK arrives, the M D flip-flop circuits 81 take in the M-bit count value CNT3 and hold the M-bit count value CNT3 as an M-bit count value DCNT3. In addition, when the reset signal RST is at the high level, the M D flip-flop circuits 81 initialize the count value DCNT3 to zero.

The subtractor 82 subtracts the M-bit count value DCNT3 from the M-bit count value CNT3, and outputs an N-bit count value CNTX.

The N D flip-flop circuits 83 take in and hold the N-bit count value CNTX in synchronization with the clock signal DCLK. In the present embodiment, when the reset signal RST is at the low level and the rising edge of the clock signal DCLK arrives, the N D flip-flop circuits 83 take in the N-bit count value CNTX and hold the N-bit count value CNTX as an N-bit reciprocal count value CNT. In addition, when the reset signal RST is at the high level, the N D flip-flop circuits 83 initialize the reciprocal count value CNT to zero. The reciprocal count value CNT is a value corresponding to a time when the phase modulation signal Xpm is at the high level. That is, the reciprocal count value CNT increases as the phase modulation signal Xpm remains at the high level for a longer period of time, and decreases as the phase modulation signal Xpm remains at the high level for a shorter period of time.

The M D flip-flop circuits 81, the subtractor 82, and the N D flip-flop circuits 83 constitute a reciprocal count value generation unit 80 that generates the reciprocal count value CNT based on a difference between the count value DCNT3 and the count value CNT3 output from the reciprocal count integrated value synthesizing unit 50.

Then, the frequency ratio digital conversion circuit 3 outputs the reciprocal count value CNT. The reciprocal count value CNT is a frequency delta-sigma modulation signal corresponding to a frequency ratio between the measurement target signal X and the reference signal CLK. Since a reciprocal of a frequency is a period, the reciprocal count value CNT can also be said to be a signal corresponding to a period ratio between the measurement target signal X and the reference signal CLK. The reciprocal count value CNT is the output signal OUT of the frequency delta-sigma modulation signal output circuit 1 shown in FIG. 19.

Figure 21:
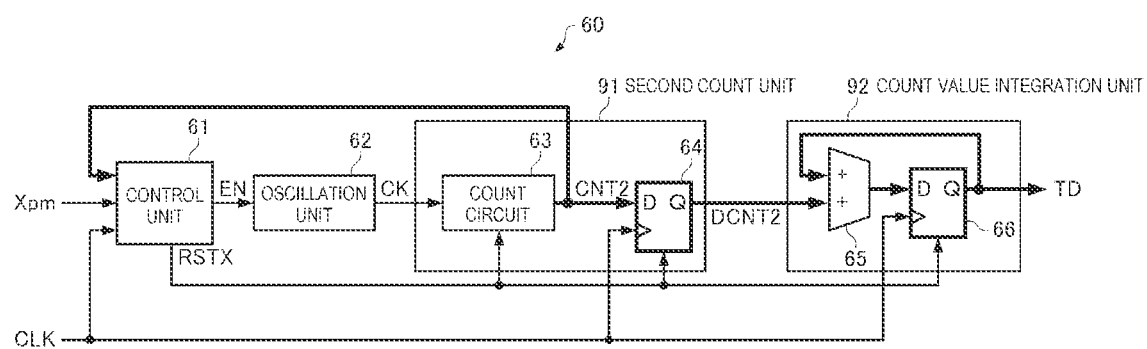
FIG. 21 is a diagram showing a configuration example of a time digital value generation unit.

FIG. 21 is a diagram showing a configuration example of the time digital value generation unit 60. As shown in FIG. 21, the time digital value generation unit 60 includes a control unit 61, an oscillation unit 62, a count circuit 63, a D flip-flop circuit 64, an adder 65, and a D flip-flop circuit 66. Although only one D flip-flop circuit 64 and only one D flip-flop circuit 66 are shown in FIG. 21 for simplification of illustration, actually, there are K D flip-flop circuits 64 and M D flip-flop circuits 66.

The control unit 61 detects the rising edge and the falling edge of the phase modulation signal Xpm, activates an enable signal EN, and outputs the enable signal EN. In the present embodiment, it is assumed that the enable signal EN is active at a high level. After setting the enable signal EN to the high level, the control unit 61 switches, based on a count value CNT2 output from the count circuit 63, the enable signal EN from the high level to a low level when the number of rising edges of a clock signal CK output from the oscillation unit 62 reaches a predetermined number. In addition, after the enable signal EN is switched from the high level to the low level, the control unit 61 activates the reset signal RST and outputs the reset signal RST when the rising edge of the reference signal CLK arrives a predetermined number of times. In the present embodiment, it is assumed that the reset signal RST is active at a high level. The control unit 61 switches the reset signal RST from the high level to a low level when a predetermined time elapses after the reset signal RST is set to the high level. The enable signal EN is supplied to the oscillation unit 62, and a reset signal RSTX is supplied to the count circuit 63, the K D flip-flop circuits 64, and the M D flip-flop circuits 66.

Figure 22:
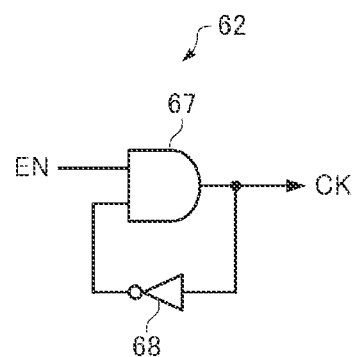
FIG. 22 is a diagram showing a configuration example of an oscillation unit.

The oscillation unit 62 oscillates when the enable signal EN is at the high level, and stops oscillation when the enable signal EN is at the low level. For example, as shown in FIG. 22, the oscillation unit 62 includes a two-input AND circuit 67 and a logic inversion circuit 68. The AND circuit 67 receives the enable signal EN and an output signal of the logical inversion circuit 68, and outputs the enable signal EN and an AND signal of the output signal of the logical inversion circuit 68. The logical inversion circuit 68 receives an output signal of the AND circuit 67, and outputs a logical inversion signal of the output signal of the AND circuit 67.

The count circuit 63 counts the number of edges of the clock signal CK. In the present embodiment, the count circuit 63 counts the number of rising edges of the clock signal CK and outputs a K-bit count value CNT2.

The K D flip-flop circuits 64 take in and hold the K-bit count value CNT2 in synchronization with the reference signal CLK. In the present embodiment, when the reset signal RST is at the low level and the rising edge of the reference signal CLK arrives, the K D flip-flop circuits 64 take in the K-bit count value CNT2 and hold the K-bit count value CNT2 as a K-bit count value DCNT2. In addition, when the reset signal RST is at the high level, the K D flip-flop circuits 64 initialize the count value DCNT2 to zero.

The count circuit 63 and the K D flip-flop circuits 64 constitute a second count unit 91 that counts an output signal from the oscillation unit 62 with reference to the reference signal CLK and generates the count value DCNT2.

The adder 65 adds an M-bit value held and output by the M D flip-flop circuits 66 and the K-bit count value DCNT2 held by the K D flip-flop circuits 64 to output an M-bit calculated value.

The M D flip-flop circuits 66 take in and hold the K-bit count value CNT2 in synchronization with the reference signal CLK. In the present embodiment, when the reset signal RST is at the low level and the rising edge of the reference signal CLK arrives, the M D flip-flop circuits 66 take in the M-bit calculated value output from the adder 65 and hold the M-bit calculated value as an M-bit time digital value TD. In addition, when the reset signal RST is at the high level, the M D flip-flop circuits 66 initialize the time digital value TD to zero.

The adder 65 and the M D flip-flop circuits 66 constitute a count value integration unit 92 that integrates the count value DCNT2 to obtain an integrated value and outputs the integrated value as the time digital value.

Figure 23:
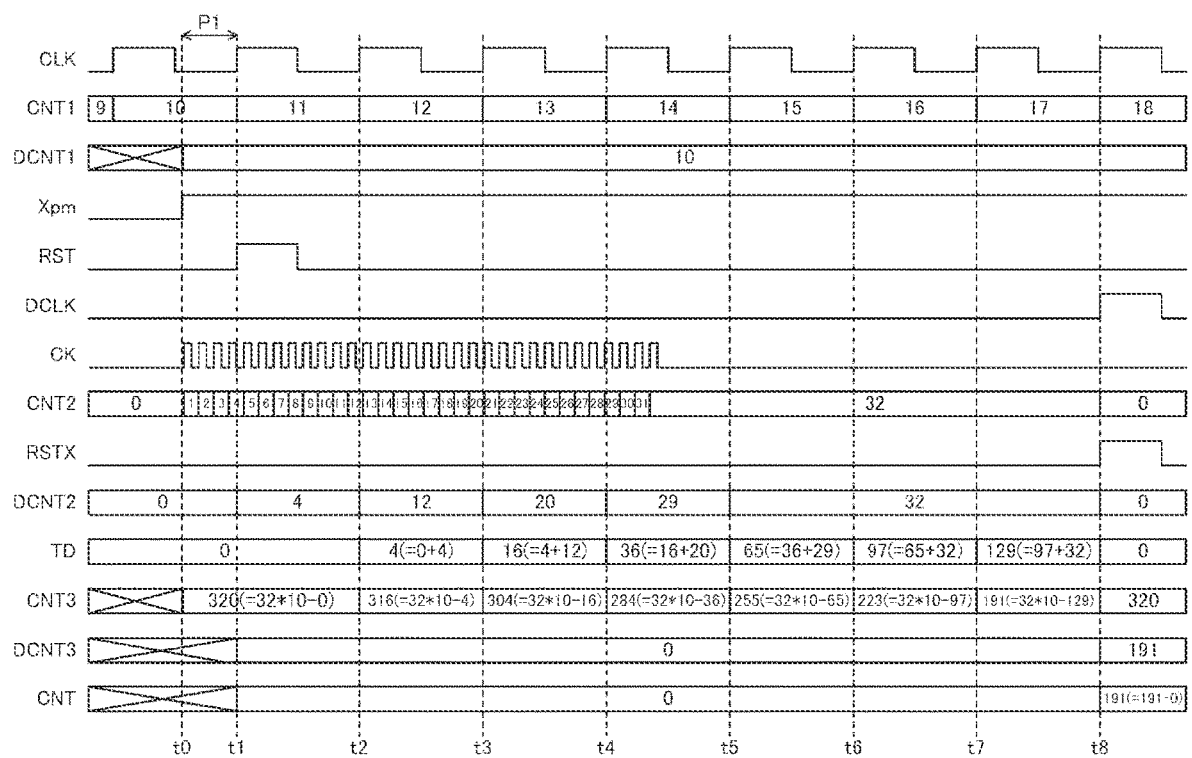
FIG. 23 is a timing chart showing an example of an operation of a frequency ratio digital conversion circuit.
Figure 24:
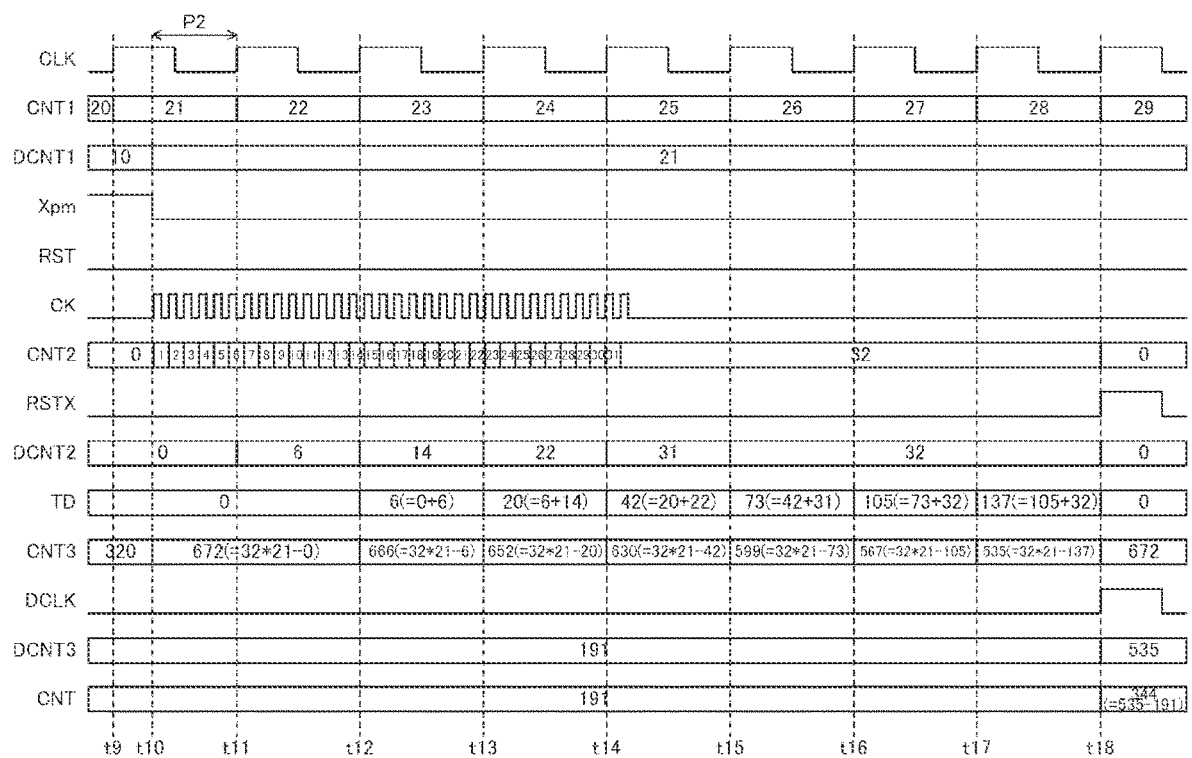
FIG. 24 is a timing chart showing an example of an operation of a frequency ratio digital conversion circuit.

Next, a detailed operation of the frequency ratio digital conversion circuit 3 according to the fourth embodiment will be described with reference to FIGS. 23 and 24. FIGS. 23 and 24 are timing charts showing examples of operations of the frequency ratio digital conversion circuit 3. In the examples of FIGS. 23 and 24, the integer k input to the multiplier 51 is 32. In addition, in the examples of FIGS. 23 and 24, the phase modulation signal Xpm is a signal having a constant period in order to simplify the description of the operation of the frequency ratio digital conversion circuit 3, and an operation principle of the frequency ratio digital conversion circuit 3 does not change even when the period of the phase modulation signal Xpm randomly changes.

As shown in FIG. 23, the count value CNT1 increases by one each time the rising edge of the reference signal CLK arrives. Then, at a time point t0, when the phase modulation signal Xpm transitions from the low level to the high level, the count value CNT1 at this time is 10, and thus the count value DCNT1 changes to 10 and the count value CNT3 changes to 320. In addition, when the phase modulation signal Xpm transitions from the low level to the high level, the oscillation of the oscillation unit 62 starts, and the count value CNT2 increases by one each time the rising edge of the clock signal CK arrives.

At a time point t1 when a time P1 has elapsed from the time point t0, the first rising edge of the reference signal CLK after the phase modulation signal Xpm transitioned to the high level arrives, and the count value DCNT2 changes from 0 to 4 in synchronization with the edge. In addition, in synchronization with the edge, the reset signal RST transitions from the low level to the high level, and the count value DCNT3 and the reciprocal count value CNT are initialized to 0. Thereafter, the reset signal RST transitions from the high level to the low level, and initialization operations of the count value DCNT3 and the reciprocal count value CNT is released.

At a time point t2, the second rising edge of the reference signal CLK arrives, and in synchronization with the edge, the count value DCNT2 changes from 4 to 12, and the time digital value TD changes from 0 to 4. In addition, the count value CNT3 changes from 320 to 316 in synchronization with the edge.

At a time point t3, the third rising edge of the reference signal CLK arrives, and in synchronization with the edge, the count value DCNT2 changes from 12 to 20, and the time digital value TD changes from 4 to 16. In addition, the count value CNT3 changes from 316 to 304 in synchronization with the edge.

At a time point t4, the fourth rising edge of the reference signal CLK arrives, and in synchronization with the edge, the count value DCNT2 changes from 20 to 29, and the time digital value TD changes from 16 to 36. In addition, the count value CNT3 changes from 304 to 284 in synchronization with the edge. Thereafter, when the count value CNT2 reaches 32, the oscillation of the oscillation unit 62 is stopped, and the count value CNT2 is held at 32.

At a time point t5, the fifth rising edge of the reference signal CLK arrives, and in synchronization with the edge, the count value DCNT2 changes from 29 to 32, and the time digital value TD changes from 36 to 65. In addition, the count value CNT3 changes from 284 to 255 in synchronization with the edge.

At a time point t6, the sixth rising edge of the reference signal CLK arrives, and in synchronization with the edge, the time digital value TD changes from 65 to 97, and the count value CNT3 changes from 255 to 223. The count value DCNT2 remains at 32.

At a time point t7, the seventh rising edge of the reference signal CLK arrives, and in synchronization with the edge, the time digital value TD changes from 97 to 129, and the count value CNT3 changes from 223 to 191. The count value DCNT2 remains at 32.

At a time point t8, the eighth rising edge of the reference signal CLK arrives, and in synchronization with the edge, the clock signal DCLK transitions from the low level to the high level, and the count value DCNT3 and the reciprocal count value CNT change from 0 to 191. In addition, in synchronization with the edge, the reset signal RSTX transitions from the low level to the high level, and the count value CNT2, the count value DCNT2, and the time digital value TD are initialized to 0. Since the time digital value TD is changed to 0, the count value CNT3 is changed from 191 to 320. Thereafter, the reset signal RSTX transitions from the high level to the low level, and the initialization of the count value CNT2, the count value DCNT2, and the time digital value TD is released.

Thereafter, after the elapse of time, as shown in FIG. 24, at a time point t9, the eleventh rising edge of the reference signal CLK arrives, and the count value CNT1 changes from 20 to 21. Then, at a time point t10, when the phase modulation signal Xpm transitions from the high level to the low level, the count value CNT1 at this time is 21, and thus the count value DCNT1 changes from 10 to 21, and the count value CNT3 changes from 320 to 672. In addition, when the phase modulation signal Xpm transitions from the high level to the low level, the oscillation of the oscillation unit 62 starts, and the count value CNT2 increases by one each time the rising edge of the clock signal CK arrives.

At a time point t11 when a time P2 has elapsed from the time point t10, the twelfth rising edge of the reference signal CLK arrives, and the count value DCNT2 changes from 0 to 6 in synchronization with the edge.

At a time point t12, the thirteenth rising edge of the reference signal CLK arrives, and in synchronization with the edge, the count value DCNT2 changes from 6 to 14, and the time digital value TD changes from 0 to 6. In addition, the count value CNT3 changes from 672 to 666 in synchronization with the edge.

At a time point t13, the fourteenth rising edge of the reference signal CLK arrives, and in synchronization with the edge, the count value DCNT2 changes from 14 to 22, and the time digital value TD changes from 6 to 20. In addition, the count value CNT3 changes from 666 to 652 in synchronization with the edge.

At a time point t14, the fifteenth rising edge of the reference signal CLK arrives, and in synchronization with the edge, the count value DCNT2 changes from 22 to 31, and the time digital value TD changes from 20 to 42. In addition, the count value CNT3 changes from 652 to 630 in synchronization with the edge. Thereafter, when the count value CNT2 reaches 32, the oscillation of the oscillation unit 62 is stopped, and the count value CNT2 is held at 32.

At a time point t15, the sixteenth rising edge of the reference signal CLK arrives, and in synchronization with the edge, the count value DCNT2 changes from 31 to 32, and the time digital value TD changes from 42 to 73. In addition, the count value CNT3 changes from 630 to 599 in synchronization with the edge.

At a time point t16, the seventeenth rising edge of the reference signal CLK arrives, and in synchronization with the edge, the time digital value TD changes from 73 to 105, and the count value CNT3 changes from 599 to 567. The count value DCNT2 remains at 32.

At a time point t17, the eighteenth rising edge of the reference signal CLK arrives, and in synchronization with the edge, the time digital value TD changes from 105 to 137, and the count value CNT3 changes from 567 to 535. The count value DCNT2 remains at 32.

At a time point t18, the nineteenth rising edge of the reference signal CLK arrives, and in synchronization with the edge, the clock signal DCLK transitions from the low level to the high level, the count value DCNT3 changes from 191 to 535, and the reciprocal count value CNT changes from 191 to 344. In addition, in synchronization with the edge, the reset signal RSTX transitions from the low level to the high level, and the count value CNT2, the count value DCNT2, and the time digital value TD are initialized to 0. Since the time digital value TD is changed to 0, the count value CNT3 is changed from 535 to 672. Thereafter, the reset signal RSTX transitions from the high level to the low level, and the initialization of the count value CNT2, the count value DCNT2, and the time digital value TD is released.

Here, the time P2 from the time point t10 to the time point t11 shown in FIG. 24 is longer than the time P1 from the time point t0 to the time point t1 shown in FIG. 23. In addition, the time digital value TD at each time point from the time point t12 to the time point t18 transitions to a value larger than the time digital value TD at each time point from the time point t2 to the time point t8. Therefore, the longer the time interval between the edge of the phase modulation signal Xpm and the rising edge of the reference signal CLK, the larger the value of the time digital value TD. Then, the time digital value TD after the change at the time point t7, that is, 129, corresponds to the time P1, and the time digital value TD after the change at the time point t17, that is, 137, corresponds to the time P2.

In the examples of FIGS. 23 and 24, when the time of one cycle of the reference signal CLK is T, the time when the phase modulation signal Xpm is at the high level is T×(21−10)+P1−P2=(T×21−P2)−(T×10−P1). Here, the count value CNT3 after the change at the time point t7, that is, 191 (=32×10−129) corresponds to (T×10−P1), and the count value CNT3 after the change at the time point t17, that is, 535 (=32×21−137) corresponds to (T×21−P2). Therefore, the reciprocal count value CNT after the change at the time point t18, that is, 344 (=535 to 191) corresponds to the time when the phase modulation signal Xpm is at the high level.

In the examples of FIGS. 23 and 24, the oscillation unit 62 stops when the oscillation unit 62 oscillates 32 times, and the count value DCNT2 is held at 32. Therefore, after the oscillation unit 62 stops, the time digital value TD increases by 32 each time the rising edge of the reference signal CLK arrives. On the other hand, since the integer k is 32, which is the same as the number of times of the oscillation, the k times the count value DCNT1 of the first count unit 40 and the time digital value TD are consistent with each other, and thus the accuracy of the reciprocal count value CNT, which is obtained from the difference between the k times the count value DCNT1 of the first count unit 40 and the time digital value TD, is improved. Accordingly, it is preferable that the number of times of the oscillation of the oscillation unit 62 is equal to the integer k. Further, at this time, it is preferable that the number of times of the oscillation of the oscillation unit 62, that is, the integer k is the n-th power of 2 (n is a positive integer). Accordingly, the multiplier 51 can be implemented as a simple circuit that shifts the count value DCNT1 by n bits.

According to the frequency delta-sigma modulation signal output circuit 1 of the fourth embodiment described above, the frequency ratio digital conversion circuit 3 can generate the frequency delta-sigma modulation signal corresponding to the frequency ratio between the measurement target signal X and the reference signal CLK by generating the reciprocal count value CNT corresponding to the time when the phase modulation signal Xpm is at the high level. The frequency ratio digital conversion circuit 3 may generate the reciprocal count value CNT corresponding to the time when the phase modulation signal Xpm is at the low level, or may generate the reciprocal count value CNT corresponding to a time interval between two rising edges or two falling edges of the phase modulation signal Xpm.

In addition, according to the frequency ratio digital conversion circuit 3 in the fourth embodiment, the frequency ratio digital conversion circuit 3 can be implemented by a simple configuration using the first count unit 40, the reciprocal count integrated value synthesizing unit 50, the time digital value generation unit 60, and the reciprocal count value generation unit 80, and the time digital value generation unit 60 can also be implemented by a simple configuration using the oscillation unit 62 and the second count unit 91, so that a circuit area of the frequency ratio digital conversion circuit 3 can be reduced. Therefore, according to the frequency delta-sigma modulation signal output circuit 1 of the fourth embodiment, it is possible to generate a frequency delta-sigma modulation signal having the same accuracy as that of the frequency delta-sigma modulation signal output circuit 1 of the third embodiment with a circuit scale smaller than that of the frequency delta-sigma modulation signal output circuit 1 of the third embodiment.

In the present embodiment, a reciprocal count method is adopted on the assumption that the frequency of the phase modulation signal Xpm is lower than the frequency of the reference signal CLK, and the same effect can be obtained by adopting a direct count method in which the reference signal CLK and the phase modulation signal Xpm are replaced with each other.

2. Sensor Module

A sensor module of the present embodiment includes the frequency delta-sigma modulation signal output circuit 1 according to any one of the above embodiments and a physical quantity sensor that outputs a frequency signal to be measured, which is an input signal of the frequency delta-sigma modulation signal output circuit 1, and outputs packet data in which detection data of a physical quantity is incorporated. For example, the physical quantity sensor is a frequency change type sensor in which the frequency of an output signal changes according to the physical quantity to be detected. The measurement target signal X in each of the above embodiments is a signal based on the output signal of the physical quantity sensor. For example, the measurement target signal X may be the output signal of the physical quantity sensor itself, or may be an output signal of an oscillation circuit (not shown) that oscillates the physical quantity sensor. Hereinafter, a sensor module 100, which is an acceleration sensor in which the physical quantity sensor detects an acceleration as a physical quantity, will be described as an example.

Figure 25:
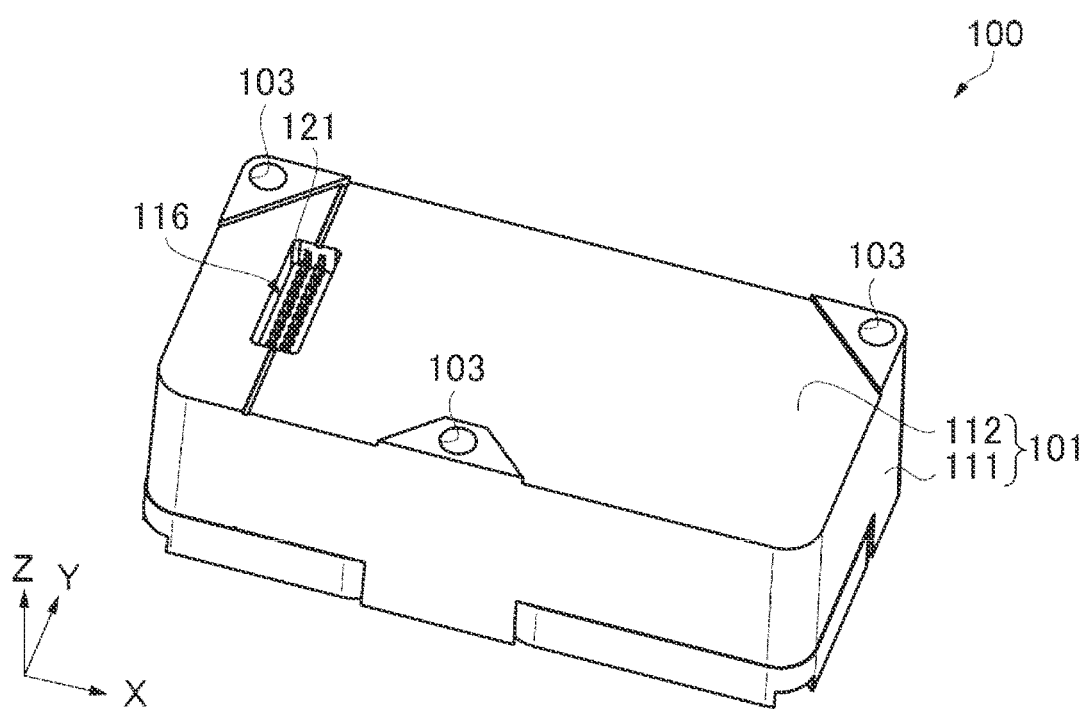
FIG. 25 is a perspective view showing a configuration of a sensor module.

FIG. 25 is a perspective view showing a configuration of the sensor module 100 when viewed from a mounted surface side to which the sensor module 100 is fixed. In the following description, a direction along a long side of the sensor module 100 having a rectangular shape in plan view is referred to as an X-axis direction, a direction orthogonal to the X-axis direction in plan view is referred to as a Y-axis direction, and a thickness direction of the sensor module 100 is referred to as a Z-axis direction.

The sensor module 100 is a rectangular parallelepiped having a rectangular planar shape, and has, for example, a size in which a length of the long side along the X-axis direction is about 50 mm, a length of a short side along the Y-axis direction orthogonal to the X-axis direction is about 24 mm, and a thickness is about 16 mm. Screw holes 103 are formed at two locations in the vicinity of end portions of one long side and at one location in a center portion of the other long side. The sensor module 100 is used in a state of being fixed to a mounted surface of a mounted body of a structure such as a bridge or a bulletin board through a fixing screw by passing into each of the three screw holes 103.

As shown in FIG. 25, an opening portion 121 is provided on a surface of the sensor module 100 as viewed from the mounted surface side. A plug type connector 116 is disposed inside the opening portion 121. The connector 116 has a plurality of pins arranged in two rows, and the plurality of pins are arranged in the Y-axis direction in each row. A socket type connector (not shown) from the mounted body is coupled to the connector 116, and transmission and reception of electric signals such as a drive voltage and detection data of the sensor module 100 are performed.

Figure 26:
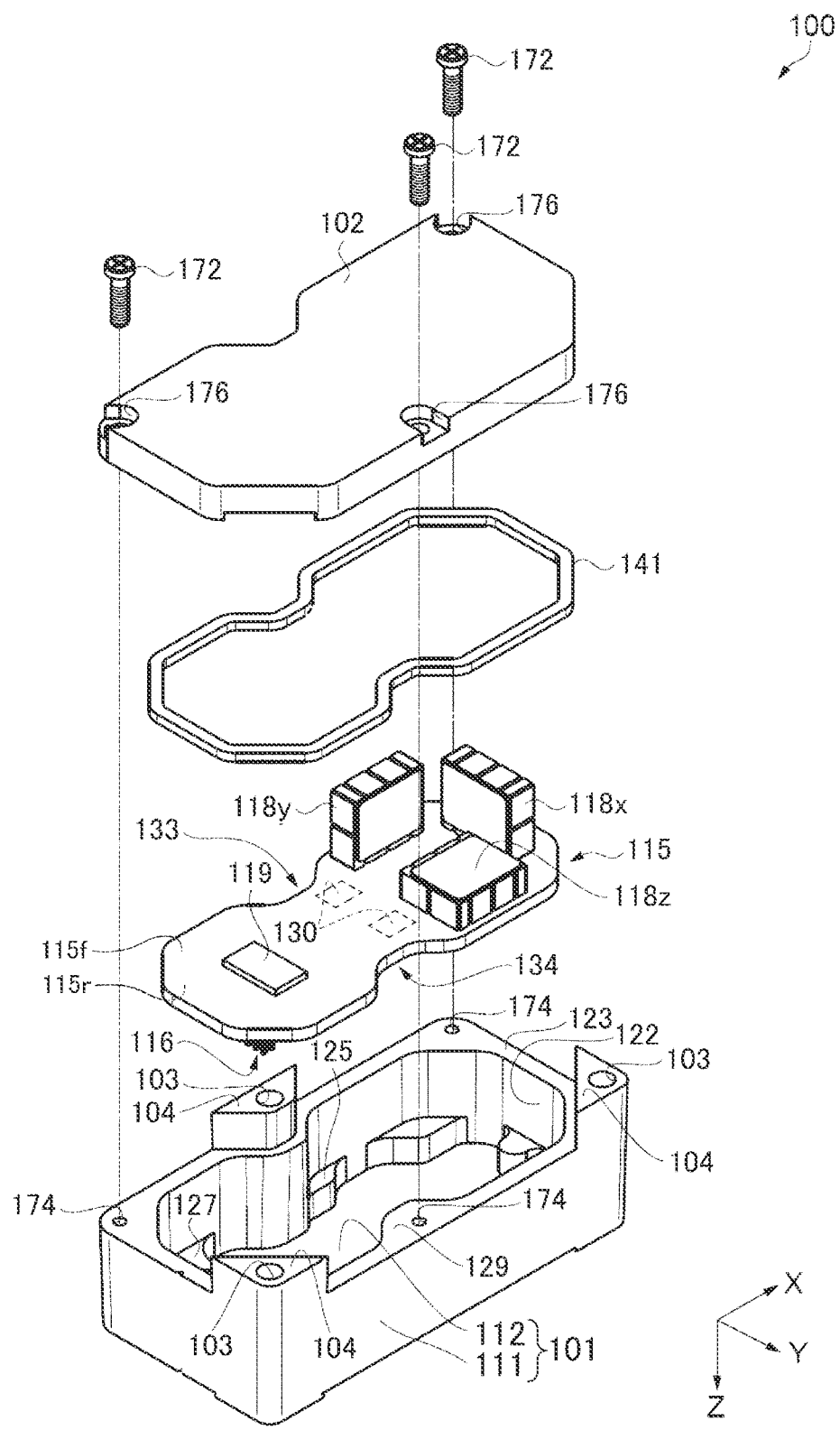
FIG. 26 is an exploded perspective view of the sensor module.

FIG. 26 is an exploded perspective view of the sensor module 100. As shown in FIG. 26, the sensor module 100 includes a container 101, a lid portion 102, a seal member 141, a circuit board 115, and the like. More specifically, the sensor module 100 has a configuration in which the circuit board 115 is attached to the inside of the container 101 with a fixing member 130 interposed therebetween, and an opening of the container 101 is covered with the lid portion 102 with the seal member 141 having a cushioning property interposed therebetween.

The container 101 is a container housing the circuit board 115 made of, for example, aluminum and formed in a box shape having an internal space. The container 101 can be formed by cutting out aluminum or by die casting. A material of the container 101 is not limited to aluminum, and other metals such as zinc and stainless steel, a resin, a composite material of a metal and a resin, and the like may be used. Similarly to the overall shape of the sensor module 100 described above, an outer shape of the container 101 is a rectangular parallelepiped having a substantially rectangular planar shape. Fixing protrusion portions 104 are provided at two locations in the vicinity of both end portions of one long side and at one location in a center portion of the other long side. The screw hole 103 is formed in each of the fixing protrusion portions 104. Here, the fixing protrusion portions 104 provided at two locations in the vicinity of both end portions of the one long side each include an intersection portion of the short side and the long side, and have a substantially triangular shape in a plan view. In addition, the fixing protrusion portion 104 provided at one location in the center portion of the other long side has a substantially trapezoidal shape facing an internal space side of the container 101 in a plan view.

The container 101 has a rectangular parallelepiped outer shape and a box shape that is open on one side. The inside of the container 101 is an internal space surrounded by a bottom wall 112 and a side wall 111. In other words, the container 101 has a box shape in which one surface facing the bottom wall 112 is an opening surface 123, an outer edge of the circuit board 115 is disposed along an inner surface 122 of the side wall 111, and the lid portion 102 is fixed so as to cover the opening. Here, the opening surface 123 facing the bottom wall 112 is a surface on which the lid portion 102 is placed. On the opening surface 123, the fixing protrusion portions 104 are erected at two locations in the vicinity of both end portions of the one long side of the container 101 and at one location at the center portion of the other long side. Then, an upper surface of the fixing protrusion portion 104, that is, a surface exposed in a –Z direction is flush with the upper surface of the container 101.

In addition, in the internal space of the container 101, a protrusion portion 129, which protrudes from the side wall 111 to the internal space side, is provided from the bottom wall 112 to the opening surface 123. The protrusion portion 129 is a center portion of one long side facing the fixing protrusion portion 104 provided at the center portion of the other long side. A female screw 174 is provided on an upper surface of the protrusion portion 129. The lid portion 102 is fixed to the container 101 via the seal member 141 by the female screw 174 and screws 172 inserted into through holes 176. Here, the fixing protrusion portion 104 provided at the center portion of the other long side may protrude from the side wall 111 to the internal space side over the bottom wall 112 to the opening surface 123, similarly to the protrusion portion 129. The protrusion portion 129 and the fixed protrusion portion 104 are provided at positions facing constricted portions 133 and 134 of the circuit board 115, which will be described later.

In the internal space of the container 101, a first pedestal 127 and a second pedestal 125 protruding in step shapes, in which one step is higher the other step, from the bottom wall 112 toward the opening surface 123 are provided. The first pedestal 127 is provided at a position facing an arrangement region of the plug type connector 116 attached to the circuit board 115, and as shown in FIG. 25, the opening portion 121 into which the plug type connector 116 is inserted is provided. The first pedestal 127 functions as a pedestal for fixing the circuit board 115 to the container 101. The opening portion 121 penetrates the inside and the outside of the container 101.

The second pedestal 125 is located on the side opposite to the first pedestal 127 with respect to the fixing protrusion portion 104 located at the center portion of the long side and the protrusion portion 129, and is provided in the vicinity of the fixing protrusion portion 104 and the protrusion portion 129. The second pedestal 125 may be coupled to either the fixing protrusion portion 104 or the protrusion portion 129. The second pedestal 125 functions as a pedestal for fixing the circuit board 115 to the container 101 on the side opposite to the first pedestal 127 with respect to the fixing protrusion portion 104 and the protrusion portion 129.

Although the outer shape of the container 101 is described as a rectangular parallelepiped having a substantially rectangular planar shape and a box shape without a lid, the planar shape of the outer shape of the container 101 is not limited thereto, and may be square, hexagonal, octagonal, and the like. In addition, in the planar shape of the outer shape of the container 101, corners of vertex portions of the polygon may be chamfered, and any one side may be a curved planar shape. In addition, the planar shape of the inside of the container 101 is not limited to the above-described shape, and may be another shape. Further, the planar shapes of the outer shape and the inside of the container 101 may be similar to each other or may not be similar to each other.

The circuit board 115 is a multilayer board in which a plurality of through holes and the like are formed, and a glass epoxy board is used as the circuit board 115. The circuit board 115 is not limited to the glass epoxy board, may be a rigid board on which a plurality of physical quantity sensors, electronic components, connectors, and the like can be mounted, and may be, for example, a composite board or a ceramic board.

The circuit board 115 has a second surface 115r on the bottom wall 112 side and a first surface 115f which has a front and back relationship with the second surface 115r. A control IC 119 as a processing unit and acceleration sensors 118x, 118y, and 118z as physical quantity sensors are mounted on the first surface 115f of the circuit board 115. In addition, the connector 116 is mounted on the second surface 115r of the circuit board 115. Although illustration and description thereof are omitted, other wirings, terminal electrodes, and the like may be provided on the circuit board 115.

The circuit board 115 includes the constricted portions 133 and 134 in which the outer edge of the circuit board 115 is constricted at the center portions in the X-axis direction along the long sides of the container 101 in a plan view. The constricted portions 133 and 134 are provided on both sides of the circuit board 115 in the Y-axis direction in the plan view, and constricted from the outer edge toward the center of the circuit board 115. In addition, the constricted portions 133 and 134 face the protrusion portion 129 and the fixing protrusion portion 104 of the container 101.

The circuit board 115 is inserted into the internal space of the container 101 with the second surface 115r facing the first pedestal 127 and the second pedestal 125. The circuit board 115 is supported by the container 101 by the first pedestal 127 and the second pedestal 125.

Each of the acceleration sensors 118x, 118y, and 118z detects an acceleration in one axial direction. Specifically, the acceleration sensor 118x is erected such that front and back surfaces of a package face the X-axis direction and the side surface faces the first surface 115f of the circuit board 115. The acceleration sensor 118x detects the acceleration applied in the X-axis direction. The acceleration sensor 118y is erected such that the front and back surfaces of a package face the Y-axis direction and the side surface faces the first surface 115f of the circuit board 115. The acceleration sensor 118y detects the acceleration applied in the Y-axis direction. The acceleration sensor 118z is provided such that front and back surfaces of a package face the Z-axis direction, that is, the front and back surfaces of the package face the first surface 115f of the circuit board 115. The acceleration sensor 118z detects the acceleration applied in the Z-axis direction.

The control IC 119 as the processing unit is electrically coupled to the acceleration sensors 118x, 118y, and 118z via wirings (not shown). IC is an abbreviation for Integrated Circuit. In addition, the control IC 119 is an MCU, incorporates the frequency delta-sigma modulation signal output circuit 1 of the above embodiments, a storage unit including a nonvolatile memory, and the like, controls each unit of the sensor module 100, generates detection data based on output signals of the acceleration sensors 118x, 118y, and 118z, and generates packet data in which the detection data is incorporated. The MCU is an abbreviation for Micro Controller Unit. The storage unit stores a program defining an order and contents for detecting the accelerations, a program for incorporating the detection data into the packet data, accompanying data, and the like. Although not shown, a plurality of other electronic components and the like may be mounted on the circuit board 115.

Here, configurations of the acceleration sensors 118x, 118y, and 118z will be described with reference to FIGS. 27 and 28.

Figure 27:
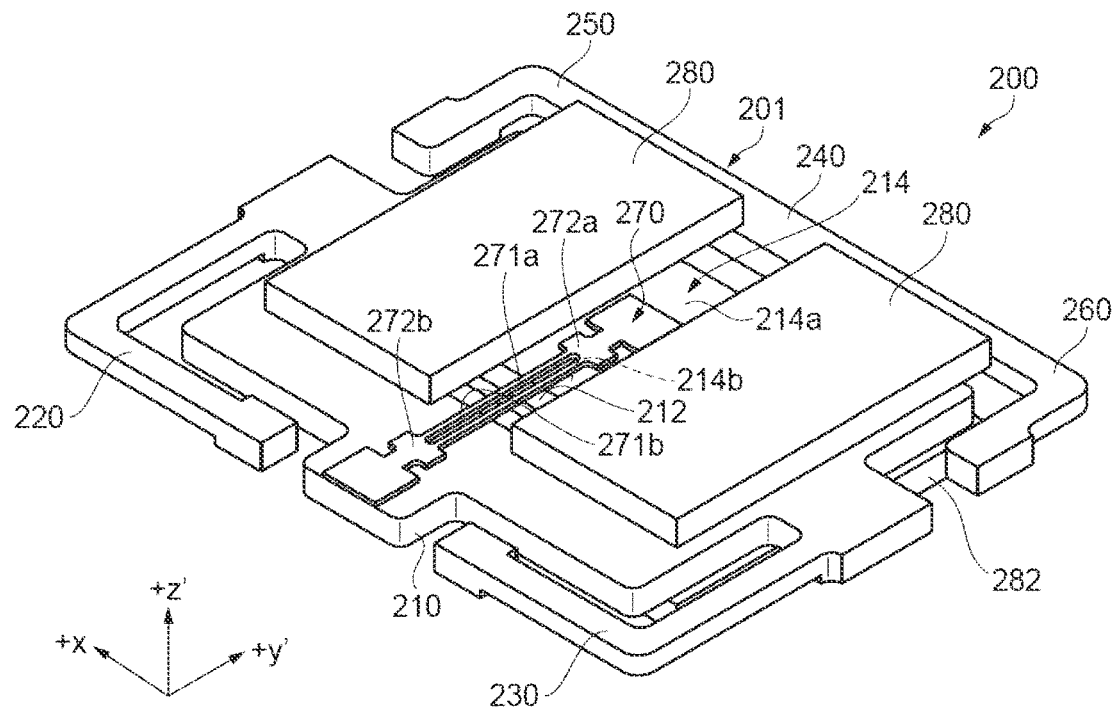
FIG. 27 is a perspective view showing a schematic configuration of a sensor element for detecting an acceleration.

FIG. 27 is a perspective view showing a schematic configuration of a sensor element for detecting an acceleration. FIG. 28 is a cross-sectional view showing a schematic configuration of an acceleration detector using the sensor element for detecting the acceleration.

In FIG. 27, the x axis, a y' axis, and a z' axis are shown as three axes orthogonal to each other. In an orthogonal coordinate system including the x axis as an electric axis, the y axis as a mechanical axis, and the z axis as an optical axis of a quartz crystal which is a piezoelectric material used as a base material of the acceleration sensor, an example will be described in which the quartz crystal is cut out along a plane defined by the x axis and the y' axis and is processed into a flat plate shape when the x axis is a rotation axis, an axis which is inclined by a rotation angle φ such that a +z side of the z axis rotates in a −y direction of the y axis is the z' axis, and an axis which is inclined by the rotation angle φ such that a +y side of the y axis rotates in a +z direction of the z axis is the y' axis, and a z' plate which is a so-called quartz crystal z plate having a predetermined thickness t in a z'-axis direction orthogonal to the plane is used as the base material. The rotation angle φ is preferably −5°≤φ≤15°. In the acceleration sensors 118x, 118y, and 118z, the z' axis is an axis along a direction in which gravity acts.

First, a configuration of a sensor element 200 that detects an acceleration will be described with reference to FIG. 27. The sensor element 200 includes a board structure 201 including a base portion 210 and the like, an acceleration detection element 270 that is coupled to the board structure 201 and detects a physical quantity, and mass portions 280 and 282.

The board structure 201 of the sensor element 200 includes the base portion 210, a movable portion 214 coupled to the base portion 210 via a joint portion 212, a coupling portion 240, and a first support portion 220, a second support portion 230, a third support portion 250, and a fourth support portion 260 which are coupled to the base portion 210. Here, the third support portion 250 and the fourth support portion 260 are coupled to each other on a side where the coupling portion 240 is disposed.

As the board structure 201, a quartz crystal board of the z' plate, which is the quartz crystal z plate cut out at a predetermined angle as described above from a raw stone of a quartz crystal which is a piezoelectric material and the like, is used. By patterning the quartz crystal board, the quartz crystal board and the board structure 201 are integrally formed as the board structure 201. In addition, for the patterning, for example, a photolithography technique and a wet etching technique can be used.

The base portion 210 is coupled to the movable portion 214 via the joint portion 212, and supports the movable portion 214. The base portion 210 is coupled to the movable portion 214 via the joint portion 212, the coupling portion 240 located on a side of the movable portion opposite to the side where the joint portion 212 is located, the first support portion 220 and the second support portion 230, and the third support portion 250 and the fourth support portion 260 coupled to each other on the coupling portion 240 side.

The joint portion 212 is provided between the base portion 210 and the movable portion 214, and is coupled to the base portion 210 and the movable portion 214. A thickness of the joint portion 212 is smaller than a thickness of the base portion 210 and a thickness of the movable portion 214, and is formed in a constricted shape in a cross-sectional view from the x-axis direction. The joint portion 212 is formed as a thin portion having a small thickness by, for example, half-etching the board structure 201 including the joint portion 212. The joint portion 212 has a function as a rotation axis along the x-axis direction as a fulcrum when the movable portion 214 is displaced with respect to the base portion 210.

The movable portion 214 is coupled to the base portion 210 via the joint portion 212. The movable portion 214 has a plate shape, and has main surfaces 214a and 214b facing each other along the z'-axis direction and having a front and back relationship. The movable portion 214 is displaced in a direction intersecting the main surfaces 214a and 214b, that is, in the z'-axis direction, with the joint portion 212 as a fulcrum, according to an acceleration which is a physical quantity applied in a direction intersecting the main surfaces 214a and 214b, that is, in the z'-axis direction.

The coupling portion 240 extends from the base portion 210 on a +x direction side where the third support portion 250 to be described later is provided to surrounds the movable portion 214 along the x-axis direction, and is coupled to the base portion 210 on a −x direction side where the fourth support portion 260 to be described later is provided.

The first support portion 220 and the second support portion 230 are provided symmetrically with respect to the acceleration detection element 270. In addition, the third support portion 250 and the fourth support portion 260 are provided symmetrically with respect to the acceleration detection element 270. In the first support portion 220, the second support portion 230, the third support portion 250, and the fourth support portion 260, the board structure 201 is supported by a fixed portion.

The acceleration detection element 270 is coupled to the base portion 210 and the movable portion 214. In other words, the acceleration detection element 270 straddles the base portion 210 and the movable portion 214. The acceleration detection element 270 includes vibration beam portions 271a and 271b as vibration portions, a first base portion 272a, and a second base portion 272b. In the acceleration detection element 270 in which the first base portion 272a and the second base portion 272b are coupled to the base portion 210, for example, when the movable portion 214 is displaced according to the physical quantity, stress is generated in the vibration beam portions 271a and 271b, and physical quantity detection information generated in the vibration beam portions 271a and 271b is changed. In other words, vibration frequencies of the vibration beam portions 271a and 271b change. The acceleration detection element 270 in the present embodiment is a double-tuning fork type vibration element including the two vibration beam portions 271a and 271b, the first base portion 272a, and the second base portion 272b. Here, the vibration beam portions 271a and 271b as the vibration portions may be referred to as vibration arms, vibration beams, columnar beams, and the like.

As the acceleration detection element 270, a quartz crystal board of the z′ plate, which is the quartz crystal z plate cut out at a predetermined angle from a raw stone of quartz crystal which is a piezoelectric material and the like, is used, similarly to the board structure 201 described above. The acceleration detection element 270 is formed by patterning the quartz crystal board by a photolithography technique and an etching technique. Accordingly, the vibration beam portions 271a and 271b, the first base portion 272a, and the second base portion 272b can be integrally formed.

A material of the acceleration detection element 270 is not limited to the quartz crystal board described above. As the material of the acceleration detection element 270, for example, a piezoelectric material such as lithium tantalate (LiTaO$_3$), lithium tetraborate (Li$_2$B$_4$O$_7$), lithium niobate (LiNbO$_3$), lead zirconate titanate (PZT), zinc oxide (ZnO), or aluminum nitride (AlN), or a semiconductor material such as silicon provided with a piezoelectric film such as zinc oxide (ZnO) or aluminum nitride (AlN) can be used. In this case, it is preferable to use the same material for the board structure 201 and the acceleration detection element 270.

Although illustration and description are omitted, the acceleration detection element 270 may be provided with an extraction electrode or an excitation electrode.

The mass portions 280 and 282 are provided on the main surface 214a of the movable portion 214 and the main surface 214b which is the back surface in the front and back relationship with the main surface 214a. Specifically, the mass portions 280 and 282 are provided on the main surface 214a and the main surface 214b via a mass bonding material (not shown). Examples of the material of the mass portions 280 and 282 include metals such as copper (Cu) and gold (Au).

In addition, in the present embodiment, the acceleration detection element 270 is implemented by the double-tuning fork type vibration element in which the vibration portion is formed by two columnar beams of the vibration beam portions 271a and 271b, and the vibration portion may be formed by one columnar beam.

Next, a configuration of an acceleration detector 300 using the above-described sensor element 200 that detects the acceleration will be described with reference to FIG. 28.

Figure 28:
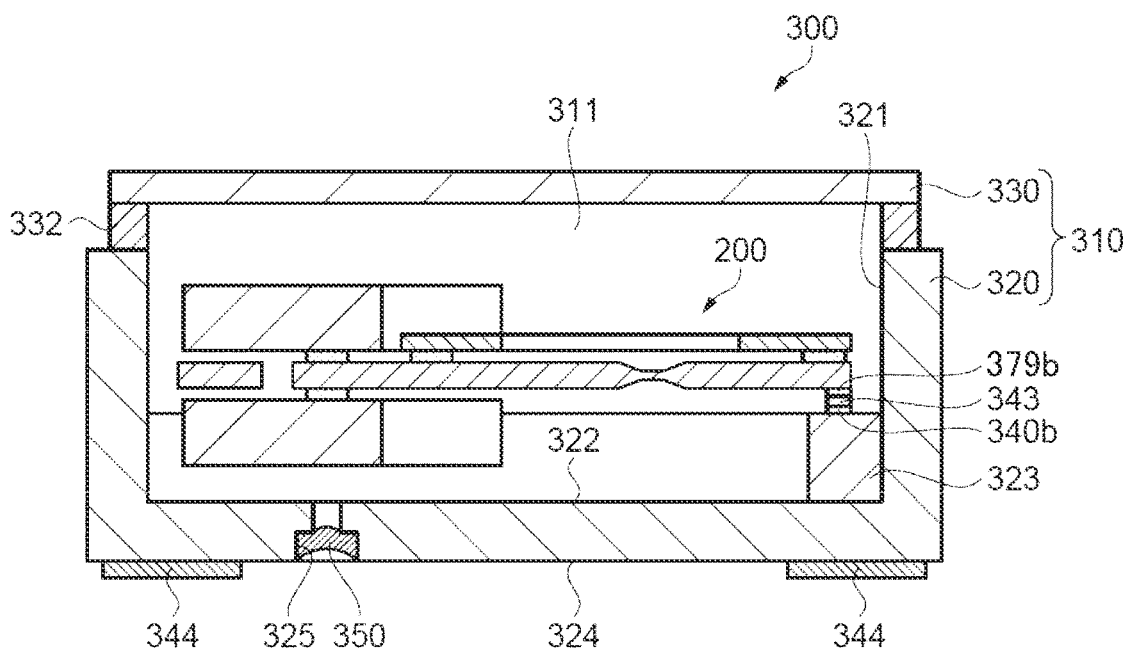
FIG. 28 is a cross-sectional view showing a schematic configuration of an acceleration detector using the sensor element for detecting the acceleration.

As shown in FIG. 28, the above-described sensor element 200 is mounted on the acceleration detector 300. The acceleration detector 300 includes the sensor element 200 and a package 310. In addition, the package 310 includes a package base 320 and a lid 330. Then, the sensor element 200 is housed in the package 310 of the acceleration detector 300. Specifically, the sensor element 200 is housed in a space 311 in which the package base 320 and the lid 330 are provided and coupled to each other.

The package base 320 has a recess portion 321, and the sensor element 200 is provided in the recess portion 321. A shape of the package base 320 is not particularly limited as long as the sensor element 200 can be housed in the recess portion 321. As the package base 320 in the present embodiment, for example, a material such as ceramics, quartz crystal, glass, or silicon can be used.

The package base 320 includes a step portion 323 protruding toward the lid 330 from an inner bottom surface 322, which is a bottom surface inside the recess portion of the package base 320. The step portion 323 is provided, for example, along an inner wall of the recess portion 321. The step portion 323 includes a plurality of internal terminals 340b.

The internal terminals 340b face fixing portion connection terminals 379b provided in fixing portions of the first support portion 220, the second support portion 230, the third support portion 250, and the fourth support portion 260 of the sensor element 200 in positions overlapping the fixing portion connection terminals 379b in a plan view. The internal terminal 340b is electrically coupled to the fixing portion connection terminal 379b using, for example, a silicone resin-based conductive adhesive 343 containing a conductive substance such as a metal filler. Accordingly, the sensor element 200 is mounted on the package base 320 and housed in the package 310.

In the package base 320, an outer bottom surface 324, which is a surface opposite to the inner bottom surface 322, is provided with external terminals 344 used when the package base 320 is mounted on an external member. The external terminals 344 are electrically coupled to the internal terminals 340b via internal wirings (not shown).

The internal terminals 340b and the external terminals 344 are formed of, for example, a metal film in which a film of nickel (Ni), gold (Au), and the like is stacked on a metallized layer of tungsten (W) and the like by a method such as plating.

The package base 320 is provided with a sealing portion 350 that seals the inside of the package 310 on a bottom portion of the recess portion 321. The sealing portion 350 is provided in a through hole 325 formed in the package base 320. The through hole 325 penetrates from the outer bottom surface 324 to the inner bottom surface 322. In the example shown in FIG. 28, the through hole 325 has a stepped shape in which a hole diameter on the outer bottom surface 324 side is larger than a hole diameter on the inner bottom surface 322 side. The sealing portion 350 is formed by disposing a sealing material made of, for example, gold (Au), a germanium (Ge) alloy, and solder in the through hole 325, heating and melting the sealing material, and then solidifying the sealing material. The sealing portion 350 hermetically seals the inside of the package 310.

The lid 330 covers the recess portion 321 of the package base 320. A shape of the lid 330 is, for example, a plate shape. As the lid 330, for example, the same material as that of the package base 320, and a metal such as an alloy of iron (Fe) and nickel (Ni) or stainless steel can be used. The lid 330 is bonded to the package base 320 via a lid bonding member 332. As the lid bonding member 332, for example, a seam ring, low-melting glass, and an inorganic adhesive can be used.

After the lid 330 is bonded to the package base 320, in a state in which the inside of the package 310 is depressurized, that is, in a state in which the degree of vacuum is high, the inside of the package 310 can be hermetically sealed by disposing the sealing material in the through hole 325, heating and melting the sealing material, and solidifying the sealing material to implement the sealing portion 350. The inside of the package 310 may be filled with an inert gas such as nitrogen, helium, or argon.

In the acceleration detector 300, when a drive signal is applied to an excitation electrode of the sensor element 200 via the external terminals 344, the internal terminals 340b, the fixing portion connection terminals 379b, and the like, the vibration beam portions 271a and 271b of the sensor element 200 vibrate at a predetermined frequency. The acceleration detector 300 outputs, as an output signal, a resonance frequency of the sensor element 200 that changes according to the applied acceleration. The acceleration detector 300 can be used as the acceleration sensors 118x, 118y, and 118z of the sensor module 100 described above, and each of the acceleration sensors 118x, 118y, and 118z outputs the measurement target signal X having a frequency corresponding to the applied acceleration.

According to the sensor module 100 of the present embodiment described above, since the frequency delta-sigma modulation signal output circuit 1 is provided, a frequency delta-sigma modulation signal in which a noise component is reduced is obtained, and thus it is possible to improve measurement accuracy of a physical quantity.

Although the sensor module 100 including the acceleration sensors 118x, 118y, and 118z as physical quantity sensors is described above as an example, a sensor module including a physical quantity sensor that detects at least one of a mass, an angular velocity, an angular acceleration, a capacitance, and a temperature as a physical quantity may be used.

For a mass sensor that detects a mass as a physical quantity, a quartz crystal vibrator microbalance method is known as a method for measuring a minute mass change. Such a mass sensor utilizes the fact that an oscillation frequency of a quartz crystal vibrator decreases as the mass of a substance attached to an electrode surface of the quartz crystal vibrator increases, and the oscillation frequency increases as the mass of a substance attached to the electrode surface decreases. A detection sensitivity of the mass sensor as described above can be calculated by the Sauerbrey equation, and for example, in the case of an AT cut quartz crystal vibrator having a basic frequency of 27 MHz, a decrease in frequency of 1 Hz corresponds to an increase in mass of 0.62 ng/cm$^2$ on the electrode surface.

In addition, an angular velocity sensor that detects an angular velocity or an angular acceleration as a physical quantity detects an angular velocity by using the fact that, when an object rotating at a constant angular velocity ω is observed from an observation point rotating at the angular velocity Ω, the angular velocity of the object appears to be ω−Ω. In such an angular velocity sensor, it is utilized that, when a sensor element receives an angular acceleration in a state where a wave having a natural frequency is circulated by electrostatically driving a disk-shaped mass using an electrode, an apparent resonance frequency observed from the electrode changes. In the angular velocity sensor as described above, there is no limitation on the bandwidth in principle, and for example, high accuracy of a technology related to frequency measurement and a technology related to the nonlinearity correction directly leads to high sensitivity of the detection sensitivity.

In addition, in a capacitance sensor that detects a capacitance as a physical quantity, a measurement target capacitance can be measured by performing RC oscillation using a reference resistance and the measurement target capacitance and measuring an oscillation frequency. When the measurement target capacitance changes, the time constant given by the RC changes and the oscillation frequency shifts. In addition, in the capacitance sensor, various error factors can be eliminated by preparing a reference capacitance separately from the measurement target capacitance, performing RC oscillation using the reference resistance and the reference capacitance, using the RC oscillation as a reference oscillation frequency, and using a mechanism for detecting a difference between the reference oscillation frequency and the previous oscillation frequency.

In addition, in a temperature sensor that detects a temperature as a physical quantity, RC oscillation is performed using a thermistor and a reference capacitance, and a temperature can be measured by measuring an oscillation frequency. When a resistance value of the thermistor changes depending on the temperature, the time constant given by the RC changes and the oscillation frequency shifts. In addition, in the temperature sensor, various error factors can be eliminated by preparing a reference resistance separately from the thermistor, performing RC oscillation using the reference resistance and the reference capacitance, using the RC oscillation as a reference oscillation frequency, and using a mechanism for detecting a difference between the reference oscillation frequency and the previous oscillation frequency.

In the sensor module 100 including the physical quantity sensor that detects various physical quantities as described above, the frequency delta-sigma modulation signal having a reduced noise component can be obtained by providing the frequency delta-sigma modulation signal output circuit 1, and thus the measurement accuracy of the physical quantities can be improved.

Although the embodiments and modifications are described above, the present disclosure is not limited to these embodiments, and can be implemented in various aspects without departing from the scope of the disclosure. For example, the above embodiments may be combined appropriately.

The present disclosure includes a configuration substantially the same as the configurations described in the embodiments, for example, a configuration having the same function, method, and result, or a configuration having the same purpose and effect. In addition, the present disclosure includes a configuration obtained by replacing a non-essential portion of the configurations described in the embodiments. In addition, the present disclosure includes a configuration having the same function and effect as the configurations described in the embodiments, or a configuration capable of achieving the same purpose. In addition, the present disclosure includes a configuration in which a known technique is added to the configurations described in the embodiments.

The following contents are derived from the above-described embodiments and modifications.

An aspect of a frequency delta-sigma modulation signal output circuit includes: a phase modulation circuit configured to generate n delay signals obtained by delaying a measurement target signal, n being an integer of 2 or more, and generate a phase modulation signal by randomly selecting one of the n delay signals in synchronization with the measurement target signal; and a frequency ratio digital conversion circuit configured to generate a frequency delta-sigma modulation signal using a reference signal and the phase modulation signal.

The frequency delta-sigma modulation signal output circuit generates the phase modulation signal in which a phase of the measurement target signal is modulated by randomly selecting any one of the n delay signals, and generates the frequency delta-sigma modulation signal using the reference signal and the phase modulation signal. Accordingly, since a phase of the phase modulation signal changes, an idle tone included in a signal obtained by sampling one of the reference signal and the phase modulation signal with the other is reduced, and a signal component caused by the idle tone included in the frequency delta-sigma modulation signal is reduced. In addition, in the frequency delta-sigma modulation signal output circuit, the phase modulation signal is generated by randomly selecting any one of the n delay signals, and thus the phase of the phase modulation signal irregularly changes. Therefore, the frequency delta-sigma modulation signal does not include a signal component of a predetermined frequency that can be generated when any one of the n delay signals is regularly selected. Therefore, according to the frequency delta-sigma modulation signal output circuit, a noise component included in the frequency delta-sigma modulation signal can be reduced.

Another aspect of a frequency delta-sigma modulation signal output circuit includes: a phase modulation circuit configured to generate n delay signals obtained by delaying a measurement target signal, n being an integer of 1 or more, and generate a phase modulation signal by randomly selecting one of the measurement target signal and the n delay signals in synchronization with the measurement target signal; and a frequency ratio digital conversion circuit configured to generate a frequency delta-sigma modulation signal using a reference signal and the phase modulation signal.

The frequency delta-sigma modulation signal output circuit generates the phase modulation signal in which a phase of the measurement target signal is modulated by randomly selecting any one of the measurement target signal and the n delay signals, and generates the frequency delta-sigma modulation signal using the reference signal and the phase modulation signal. Accordingly, since a phase of the phase modulation signal changes, an idle tone included in a signal obtained by sampling one of the reference signal and the phase modulation signal with the other is reduced, and a signal component caused by the idle tone included in the frequency delta-sigma modulation signal is reduced. In addition, in the frequency delta-sigma modulation signal output circuit, the phase modulation signal is generated by randomly selecting any one of the measurement target signal and the n delay signals, and thus the phase of the phase modulation signal irregularly changes. Therefore, the frequency delta-sigma modulation signal does not include a signal component of a predetermined frequency that can be generated when any one of the measurement target signal and the n delay signals is regularly selected. Therefore, according to the frequency delta-sigma modulation signal output circuit, a noise component included in the frequency delta-sigma modulation signal can be reduced.

In addition, in the frequency delta-sigma modulation signal output circuit, since the measurement target signal is included in a target to be selected by the phase modulation circuit, it is possible to reduce the total number of delay signals by one, and it is possible to reduce the size.

In the aspect of the frequency delta-sigma modulation signal output circuit, the frequency ratio digital conversion circuit may include a plurality of frequency delta-sigma modulation circuits coupled in parallel, and generate the frequency delta-sigma modulation signal based on output signals of the plurality of frequency delta-sigma modulation circuits.

According to the frequency delta-sigma modulation signal output circuit, since the signal component caused by the idle tone included in the frequency delta-sigma modulation signal is smoothed, the noise component included in the frequency delta-sigma modulation signal can be further reduced.

The aspect of the frequency delta-sigma modulation signal output circuit may further include: a filter circuit at a subsequent stage of the frequency ratio digital conversion circuit.

According to the frequency delta-sigma modulation signal output circuit, the frequency delta-sigma modulation signal in which the noise component is further reduced is obtained by the filter circuit. In addition, according to the frequency delta-sigma modulation signal output circuit, the frequency delta-sigma modulation signal generated by the frequency ratio digital conversion circuit does not include a signal component of a predetermined frequency, and therefore, a cutoff frequency of the filter circuit is less restricted, and the degree of freedom in design is high.

In the aspect of the frequency delta-sigma modulation signal output circuit, the frequency ratio digital conversion circuit may generate a time digital value corresponding to a phase difference between the reference signal and the phase modulation signal, and generate the frequency delta-sigma modulation signal based on the time digital value.

According to the frequency delta-sigma modulation signal output circuit, since the frequency ratio digital conversion circuit can be implemented by a simple configuration, a circuit area of the frequency ratio digital conversion circuit 3 can be reduced.

An aspect of a sensor module includes: the aspect of the frequency delta-sigma modulation signal output circuit; and a physical quantity sensor, in which the measurement target signal is a signal based on an output signal of the physical quantity sensor.

According to the sensor module, since the frequency delta-sigma modulation signal output circuit is provided, a frequency delta-sigma modulation signal in which a noise component is reduced can be obtained, and thus measurement accuracy can be improved.

In the aspect of the sensor module, the physical quantity sensor may detect one of a mass, an acceleration, an angular velocity, an angular acceleration, a capacitance, and a temperature.

What is claimed is:
1. A frequency delta-sigma modulation signal output circuit comprising:

a phase modulation circuit configured to generate n delay signals obtained by delaying a measurement target signal, n being an integer of 2 or more, and generate a phase modulation signal by randomly selecting one of the n delay signals in synchronization with the measurement target signal; and a frequency ratio digital conversion circuit configured to generate a frequency delta-sigma modulation signal using a reference signal and the phase modulation signal.

2. The frequency delta-sigma modulation signal output circuit according to claim 1, wherein the frequency ratio digital conversion circuit includes a plurality of frequency delta-sigma modulation circuits coupled in parallel, and generates the frequency delta-sigma modulation signal based on output signals of the plurality of frequency delta-sigma modulation circuits.

3. The frequency delta-sigma modulation signal output circuit according to claim 1, further comprising:

a filter circuit at a subsequent stage of the frequency ratio digital conversion circuit.

4. The frequency delta-sigma modulation signal output circuit according to claim 1, wherein the frequency ratio digital conversion circuit generates a time digital value corresponding to a phase difference between the reference signal and the phase modulation signal, and generates the frequency delta-sigma modulation signal based on the time digital value.

5. A sensor module comprising:

the frequency delta-sigma modulation signal output circuit according to claim 1; and a physical quantity sensor, wherein the measurement target signal is a signal based on an output signal of the physical quantity sensor.

6. The sensor module according to claim 5, wherein the physical quantity sensor detects one of a mass, an acceleration, an angular velocity, an angular acceleration, a capacitance, and a temperature.

7. A frequency delta-sigma modulation signal output circuit comprising:

a phase modulation circuit configured to generate n delay signals obtained by delaying a measurement target signal, n being an integer of 1 or more, and generate a phase modulation signal by randomly selecting one of the measurement target signal and the n delay signals in synchronization with the measurement target signal; and a frequency ratio digital conversion circuit configured to generate a frequency delta-sigma modulation signal using a reference signal and the phase modulation signal.

* * * * *